US012701722B2

(12) United States Patent
Tsai et al.

(10) Patent No.: US 12,701,722 B2
(45) Date of Patent: Aug. 4, 2026

(54) SEMICONDUCTOR DEVICE AND METHOD FOR FORMING THE SAME

(71) Applicant: Taiwan Semiconductor Manufacturing Co., Ltd., Hsinchu (TW)

(72) Inventors: Shin-Hung Tsai, Hsinchu (TW); Cheng-Hao Hou, Hsinchu (TW); Te-Yang Lai, Hsinchu (TW); Da-Yuan Lee, Jhubei City (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1037 days.

(21) Appl. No.: 17/811,105

(22) Filed: Jul. 7, 2022

(65) Prior Publication Data

US 2023/0343818 A1 Oct. 26, 2023

Related U.S. Application Data

(60) Provisional application No. 63/363,589, filed on Apr. 26, 2022.

(51) Int. Cl.
*H10D 1/00* (2025.01)
*C23C 8/12* (2006.01)
(Continued)

(52) U.S. Cl.
CPC ............... *H10D 1/042* (2025.01); *C23C 8/12* (2013.01); *C23C 16/06* (2013.01); *C23C 16/403* (2013.01);
(Continued)

(58) Field of Classification Search
CPC .... H10D 30/475; H10D 30/47; H10D 64/411; H10D 1/68; H10D 1/041; H01L 21/022;
(Continued)

(56) References Cited

U.S. PATENT DOCUMENTS

| | | | |
|---|---|---|---|
| 10,629,428 B2 | 4/2020 | Siddiqui et al. | |
| 11,594,593 B2 | 2/2023 | Lin et al. | |

(Continued)

FOREIGN PATENT DOCUMENTS

| | | |
|---|---|---|
| DE | 102019200988 A1 | 9/2019 |
| KR | 20060052474 A | 5/2006 |

(Continued)

*Primary Examiner* — Alia Sabur
(74) *Attorney, Agent, or Firm* — Slater Matsil, LLP

(57) ABSTRACT

A method includes forming a capacitor, which includes forming a first capacitor electrode, forming a first capacitor insulator over the first capacitor electrode, and forming a second capacitor electrode over and contacting the first capacitor insulator. The formation of the first capacitor insulator includes oxidizing a top surface layer of the first capacitor electrode to form a metal oxide layer on the first capacitor electrode, depositing an aluminum oxide layer through a first ALD process having a first plurality of ALD cycles, with the first plurality of ALD cycles having a first ALD cycle number, and depositing a high-k dielectric layer over the aluminum oxide layer. The high-k dielectric layer is deposited through a second ALD process having a second ALD cycle number different from the first ALD cycle number.

20 Claims, 20 Drawing Sheets

(51) Int. Cl.

| | |
|---|---|
| *C23C 16/06* | (2006.01) |
| *C23C 16/40* | (2006.01) |
| *C23C 16/455* | (2006.01) |
| *H10D 1/68* | (2025.01) |
| *H10P 14/60* | (2026.01) |
| *H10W 20/40* | (2026.01) |

(52) U.S. Cl.
CPC ....... *C23C 16/45525* (2013.01); *H10D 1/716* (2025.01); *H10P 14/6314* (2026.01); *H10W 20/496* (2026.01)

(58) Field of Classification Search
CPC ........... H01L 21/02244; H01L 21/0228; H01L 21/3142; H01L 21/31616; C23C 16/45525; H10P 14/6314
See application file for complete search history.

(56) References Cited

U.S. PATENT DOCUMENTS

| | | | | |
|---|---|---|---|---|
| 2002/0115252 | A1* | 8/2002 | Haukka | H10D 64/685 |
| | | | | 257/E21.01 |
| 2005/0141168 | A1 | 6/2005 | Lee et al. | |
| 2005/0173778 | A1 | 8/2005 | Won et al. | |
| 2006/0097305 | A1 | 5/2006 | Lee | |
| 2009/0085082 | A1* | 4/2009 | Dewey | H01L 21/31645 |
| | | | | 257/E29.345 |
| 2010/0091428 | A1 | 4/2010 | Kim et al. | |
| 2010/0219502 | A1* | 9/2010 | Shieh | H01L 24/06 |
| | | | | 257/532 |
| 2011/0057239 | A1 | 3/2011 | Arao | |
| 2013/0175666 | A1 | 7/2013 | Tran et al. | |
| 2016/0204190 | A1* | 7/2016 | Chu | H01L 23/5223 |
| | | | | 257/532 |
| 2017/0309701 | A1 | 10/2017 | Chang et al. | |
| 2018/0006108 | A1* | 1/2018 | Ando | H10D 1/696 |
| 2021/0091169 | A1* | 3/2021 | Lin | H10B 61/10 |

FOREIGN PATENT DOCUMENTS

| | | | |
|---|---|---|---|
| KR | 20070000707 | A | 1/2007 |
| KR | 20210035693 | A | 4/2021 |

* cited by examiner

FIG. 2

SEMICONDUCTOR DEVICE AND METHOD FOR FORMING THE SAME

PRIORITY CLAIM AND CROSS-REFERENCE

This application claims the benefit of the following provisionally filed U.S. Patent application: Application No. 63/363,589, filed on Apr. 26, 2022, and entitled "MIM Structure and Method for Forming the same," which application is hereby incorporated herein by reference.

BACKGROUND

Metal-Insulator-Metal (MIM) capacitors have been widely used in functional circuits such as mixed signal circuits, analog circuits, Radio Frequency (RF) circuits, Dynamic Random-Access Memories (DRAMs), embedded DRAMs, and logic operation circuits. In system-on-chip applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling.

Decoupling capacitors are used to decouple some parts of electrical networks from others. Noise caused by certain circuit elements is shunted through the decoupling capacitors, hence reducing the effect of the noise-generating circuit elements on adjacent circuits. In addition, Decoupling capacitors are also used in power supplies, so that the power supplies may accommodate the variations in current-draw, and the noise (variation) in power supply voltage can be suppressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 14 illustrate the cross-sectional views of intermediate stages in the formation of a MIM capacitor in accordance with some embodiments.

DETAILED DESCRIPTION

Figure 1:
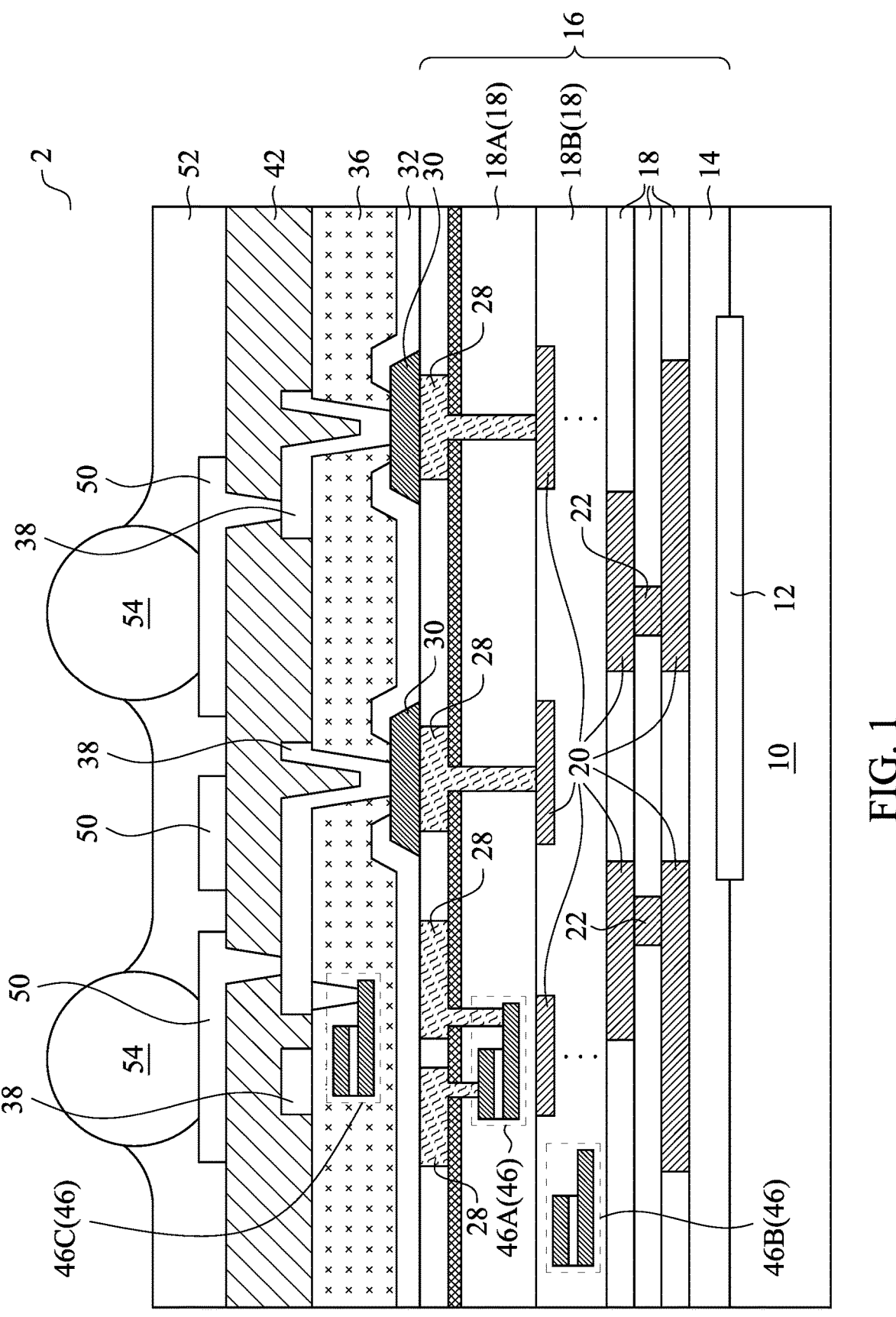
FIG. 1 illustrates a cross-sectional view of a package component including one or a plurality of Metal-Insulator-Metal (MIM) capacitors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A capacitor and the method of forming the same are provided. In accordance with some embodiments, the formation of a capacitor insulator in a Metal-Insulator-Metal (MIM) capacitor includes depositing a bottom dielectric layer-stack and a plurality of upper dielectric layer-stacks over the bottom dielectric layer-stack. The bottom dielectric layer-stack has a first aluminum oxide layer, and the plurality of upper dielectric layer-stacks may have second aluminum oxide layers. The first aluminum oxide layer has an increased thickness, and has improved adhesion to the underlying capacitor electrode. Also, the delamination of the first aluminum oxide layer from the underlying capacitor electrode is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates a cross-sectional view of package component 2 including a capacitor(s) therein. Package component 2 may be a device wafer, an interposer wafer, a package (such as an Integrated Fan-Out (InFO) package), or the like. In the subsequently illustrated embodiments, a device wafer is used as an example, and capacitors may be formed in the back-end redistribution structure of the device wafer, while the capacitor(s) may be formed in other structures. An example structure of wafer 2 is discussed herein to show where a capacitor(s) may be formed. The capacitor in accordance with the embodiments of the present disclosure, however, are not limited to the illustrative structure of wafer 2.

Referring to FIG. 1, wafer 2 includes semiconductor substrate 10. In accordance with some embodiments, semiconductor substrate 10 is a bulk silicon substrate or a silicon-on-insulator substrate. In accordance with alternative embodiments of the present disclosure, other semiconductor materials that include group III, group IV, and/or group V elements may also be used, which may include silicon germanium, silicon carbon, and/or III-V compound semiconductor materials. Integrated circuit devices 12, which may include active devices such as transistors are formed at a surface of semiconductor substrate 10.

Wafer 2 may further include Inter-Layer Dielectric (ILD) 14 and interconnect structure 16 over semiconductor substrate 10. Interconnect structure 16 includes metal lines 20 and vias 22, which are formed in dielectric layers 18. The metal lines at a same level are collectively referred to as being a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In accordance with some embodiments, dielectric layers 18 are formed of low-k dielectric materials. The dielectric constants (k values) of the low-k dielectric materials may be lower than about 3.5, or lower than about 3.0, for example.

Metal pads 30 are formed over interconnect structure 16, and may be electrically coupled to integrated circuit devices 12 through metal lines 20 and vias 22. Metal pads 30 may be aluminum pads or aluminum-copper pads, and hence are alternatively referred to as aluminum pads 30 hereinafter, while other metallic materials may be used. In accordance with some embodiments, metal pads 30 are in physical contact with the underlying metal vias or metal lines (or pads) in the top metal layer in interconnect structure 16. For example, as shown in FIG. 1, metal pads 30 have bottom surfaces in contact with the top surfaces of metal pads 28.

As also shown in FIG. 1, passivation layer 32 is formed over interconnect structure 16. Passivation layer 32 has a k value equal to or greater than 3.8, and is formed using a non-low-k dielectric material(s). In accordance with some embodiments, passivation layer 32 is a composite layer including a silicon oxide layer (not shown), and a silicon nitride layer (not shown) over the silicon oxide layer. Passivation layer 32 may also be formed of other non-porous dielectric materials such as Un-doped Silicate Glass (USG), silicon oxynitride, and/or the like.

Passivation layer 32 is patterned, so that some portions of passivation layer 32 cover the edge portions of aluminum pads 30, and the central portions of aluminum pads 30 are exposed through the openings in passivation layer 32. Passivation layer 32 and metal pads 30 have some portions level with each other in accordance with some embodiments.

Polymer layer 36 is formed over metal pads 30 and passivation layer 32. In accordance with some embodiments, polymer layer 36 is formed of polybenzoxazole (PBO). In accordance with alternative embodiments, polymer layer 36 is formed of other polymers such as polyimide, benzocyclobutene (BCB), or the like. The material of polymer layer 36 may be photo sensitive, although non-photo-sensitive materials may also be used.

Post-Passivation Interconnect (PPI) 38 may formed, which includes line portions over polymer layer 36, and via portions extending into polymer layer 36. PPI 38 is thus electrically connected to metal pads 30. PPI 38 may be formed of copper or a copper alloy, for example.

Polymer layer 42 is formed over polymer layer 36 and PPI 38. In accordance with some embodiments, polymer layer 42 is formed of a polymer such as PBO, polyimide, BCB, or the like. The material of polymer layer 42 may be photo sensitive, although non-photo-sensitive materials may also be used. Polymer layers 36 and 42 may be formed of a same type of polymer, or may be formed of different types of polymers.

PPI 50 is formed over polymer layer 42, and is electrically connected to PPI 38 and integrated circuit 12. PPI 50 includes a plurality of redistribution lines. In accordance with some embodiments, PPI 50 is in dielectric layer 52, which encircles PPI 50, and contacts the top surface of polymer layer 42. Dielectric layer 52 may be a molding compound, a polymer layer, or the like. The top surfaces and the sidewalls of PPI 50 may also be in physical contact with dielectric layer 52.

In accordance with some embodiments, electrical connectors 54 are formed to electrically connect to PPI 50. Electrical connectors 54 may include metal regions, which may include solder balls placed on PPI 50. Electrical connectors 54 may also include metal pillars. In the embodiments in which electrical connectors 54 include solder, the solder may be placed or plated, and the plating of solder may be similar to the formation of PPI 38. Electrical connectors 54 have upper portions over the top surface of dielectric layer 52, and lower portions embedded in dielectric layer 52. After the formation of electrical connectors 54, wafer 2 may be sawed into individual package components (which may be device dies), each including integrated circuit device 12 and one capacitor 46 or a plurality of capacitors 46.

In accordance with some embodiments, capacitor 46 (represented by 46A, 46B, and/or 46C) is formed in one of dielectric layers 18, or in polymer layer 36 or 42. For example, capacitor 46 may be in the top dielectric layer immediately underlying the passivation layer 32, as represented by capacitor 46A. Capacitor 46 may also be in a dielectric layer under the top dielectric layer, as represented by capacitor 46B. Capacitor 46 may also be in a polymer layer such as polymer layer 36 or 42, as represented by capacitor 46C. In accordance with some embodiments, capacitor 46 is a decoupling capacitor, with the top electrode and the bottom electrode of capacitor 46 being electrically coupled to power supply lines such as VDD and VSS. Accordingly, capacitor 46 is used to filter noise and/or also used as a power storage for reducing the voltage variation resulted from the current-drawn from the power source. In accordance with alternative embodiments of the present disclosure, the top electrode and the bottom electrode of capacitor 46 are connected to signal lines, and capacitor 46 is used to filter noise. The top electrode and the bottom electrode of capacitor 46 are connected to vias, as will be provided in the subsequently discussed process flow. In accordance with alternative embodiments, capacitor 46 is used for other purposes such as in Dynamic Random-Access Memory (DRAM) cells.

Figure 24:
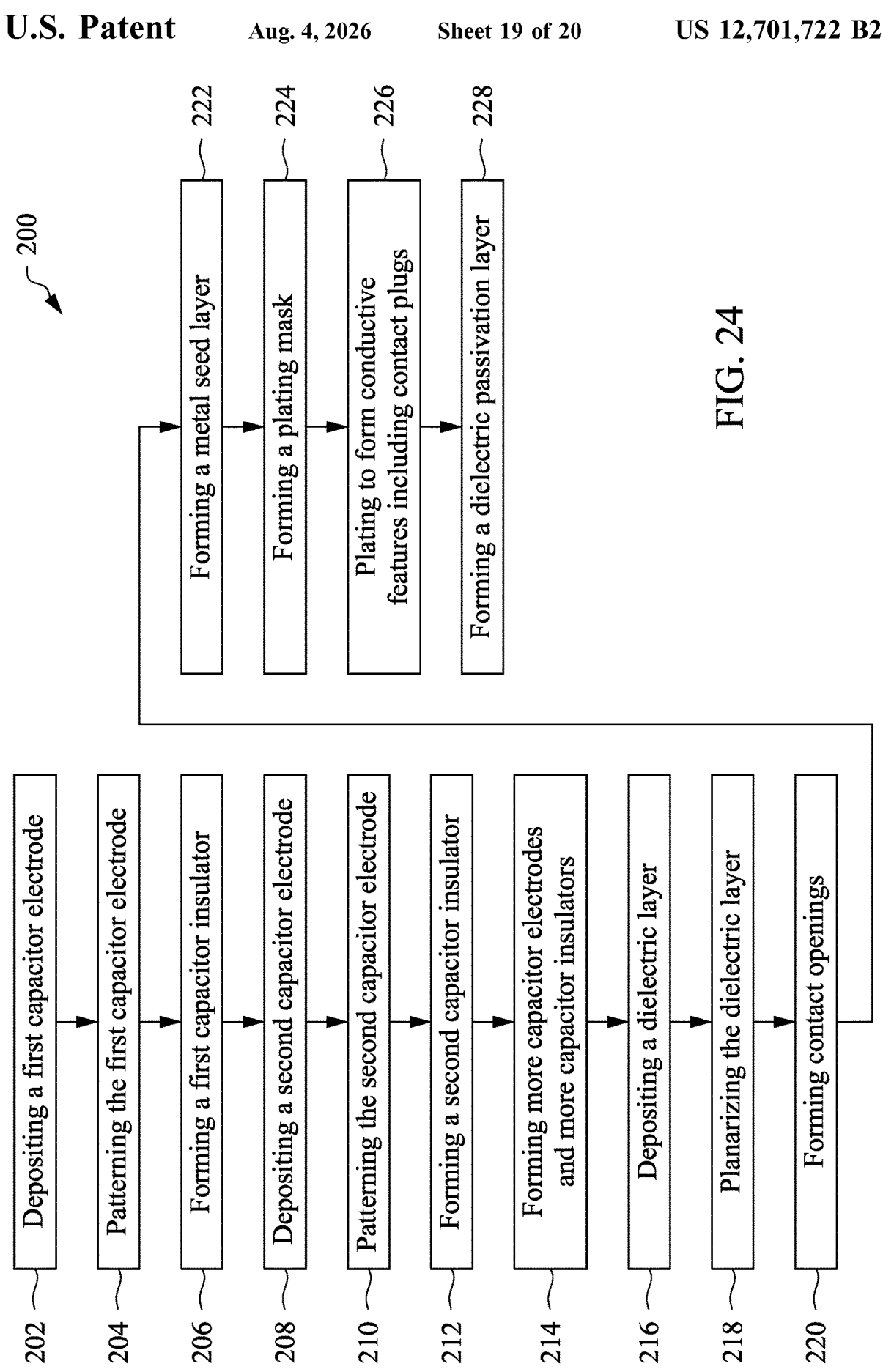
FIG. 24 illustrates a process flow for forming a MIM capacitor in accordance with some embodiments.

FIGS. 2 through 14 illustrate the cross-sectional views of intermediate stages in the formation of capacitor 46 in wafer 2 in accordance with some embodiments. The processes shown in FIG. 2 through 14 are also illustrated schematically in the process flow 200 as shown in FIG. 24. The process shown in FIGS. 2 through 14 may represent the process for forming capacitor 46A in dielectric layer 18A as shown in FIG. 1. The concept of the example embodiments may be used for forming capacitors in various layers, as represented by capacitors 46B and 46C in FIG. 1.

Figure 2:
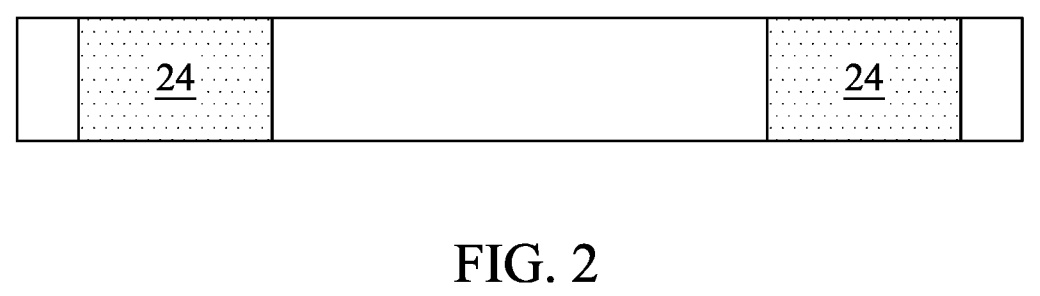

Referring to FIG. 2, conductive features 24 are illustrated, and the portions of wafer 2 underlying conductive features 24 are not illustrated, while they still exist as shown in FIG. 1. In accordance with some embodiments in which capacitor 46A (FIG. 1) is to be formed, conductive features 24 are the metal lines or metal pads formed in dielectric layer 18B (FIG. 1). In accordance with alternative embodiments in which capacitor 46B (FIG. 1) is to be formed, conductive features 24 are the metal lines or metal pads underlying dielectric layer 18B. In accordance with yet other embodiments in which capacitor 46C (FIG. 1) is to be formed, conductive features 24 are metal pads 30 or some portions of PPI 38.

Figure 3:
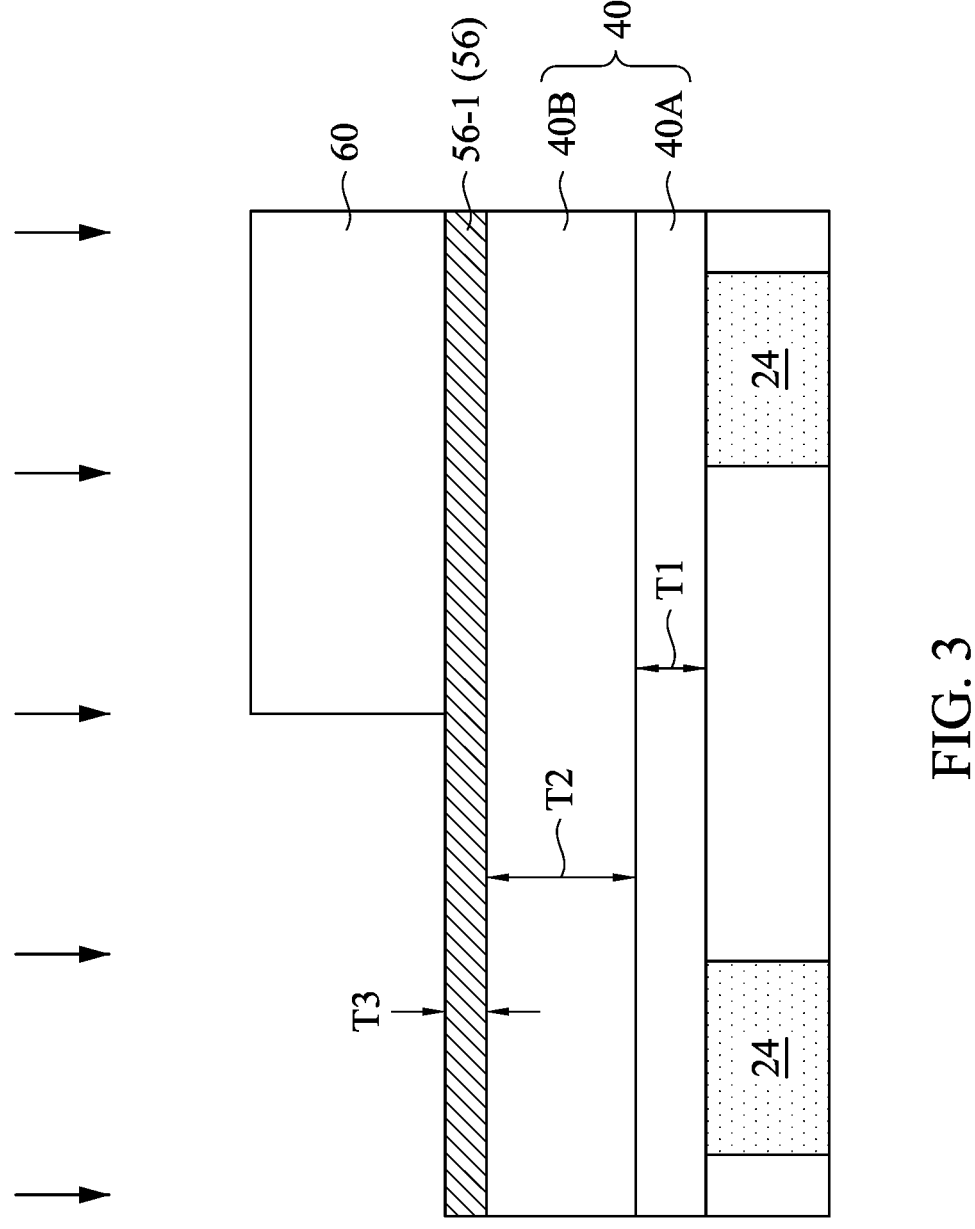

Referring to FIG. 3, dielectric layers 40 are formed over conductive features 24. Dielectric layers 40 include dielectric layer 40A and dielectric layer 40B over dielectric layer 40A. Dielectric layers 40A and 40B are formed of different materials, which may be inorganic materials in accordance with some embodiments. For example, dielectric layer 40A may be formed of silicon carbide, silicon carbo-nitride (SiCN), or the like. Thickness T1 of dielectric layer 40A may be in the range between about 700 Å and about 2,000 Å. Dielectric layer 40B may be formed of silicon nitride, silicon oxynitride (SiON), or the like. Thickness T2 of dielectric layer 40B may be in the range between about 4 kÅ and about 10 kÅ. Dielectric layers 40A and 40B may be formed using Plasma Enhance Chemical Vapor Deposition (PECVD), Low-Pressure Chemical Vapor Deposition (LPCVD), Atomic Layer Deposition (ALD), or the like.

Next, bottom capacitor electrode 56-1 is deposited as a blanket layer. The respective process is illustrated as process 202 in the process flow 200 as shown in FIG. 24. Bottom capacitor electrode 56-1 is formed of a conductive material. For example, bottom capacitor electrode 56-1 may be formed of or comprise a metal nitride such as titanium nitride (TiN), tantalum nitride (TaN), or the like, which may have thickness T3 in the range between about 150 Å and about 500 Å. The deposition process may include Chemical Vapor Deposition (CVD), PECVD, or the like.

Etching mask 60 is then formed, and is patterned. In accordance with some embodiments, etching mask 60 comprises a photoresist. Next, an etching process is performed to pattern bottom capacitor electrode 56-1. The respective process is illustrated as process 204 in the process flow 200 as shown in FIG. 24. In accordance with some embodiments, the etching is performed through a dry etching process. The etching gas may include a chlorine-based gas such as TiClx, TaClx, WClx, chlorine ($Cl_2$), and/or the like. The etching gas may also include a fluorine-containing gas such as $CHF_3$, $CF_4$, or the like, or the combination of the aforementioned gases. Oxygen ($O_2$) may also be included in the etching gas. In accordance with some embodiments, the pressure of the process gas is in the range between about 5 mTorr and about 10 mTorr. The flow rate of the process gas may be in the range between about 20 sccm and about 800 sccm. The source power (used to generate plasma) may be in the range between about 1,000 Watts and about 1,500 Watts. The bias power may be in the range between about 80 Watts and about 100 Watts.

In accordance with alternative embodiments, the etching is performed through a wet etching process. The etching chemical may include the mixture of $NH_4OH$ (ammonia water) and $H_2O_2$, the mixture of $H_2O_2$ and $H_2O$, and/or the like. Etching mask 60 is then removed, and the resulting structure is shown in FIG. 4.

Figures 4, 5:
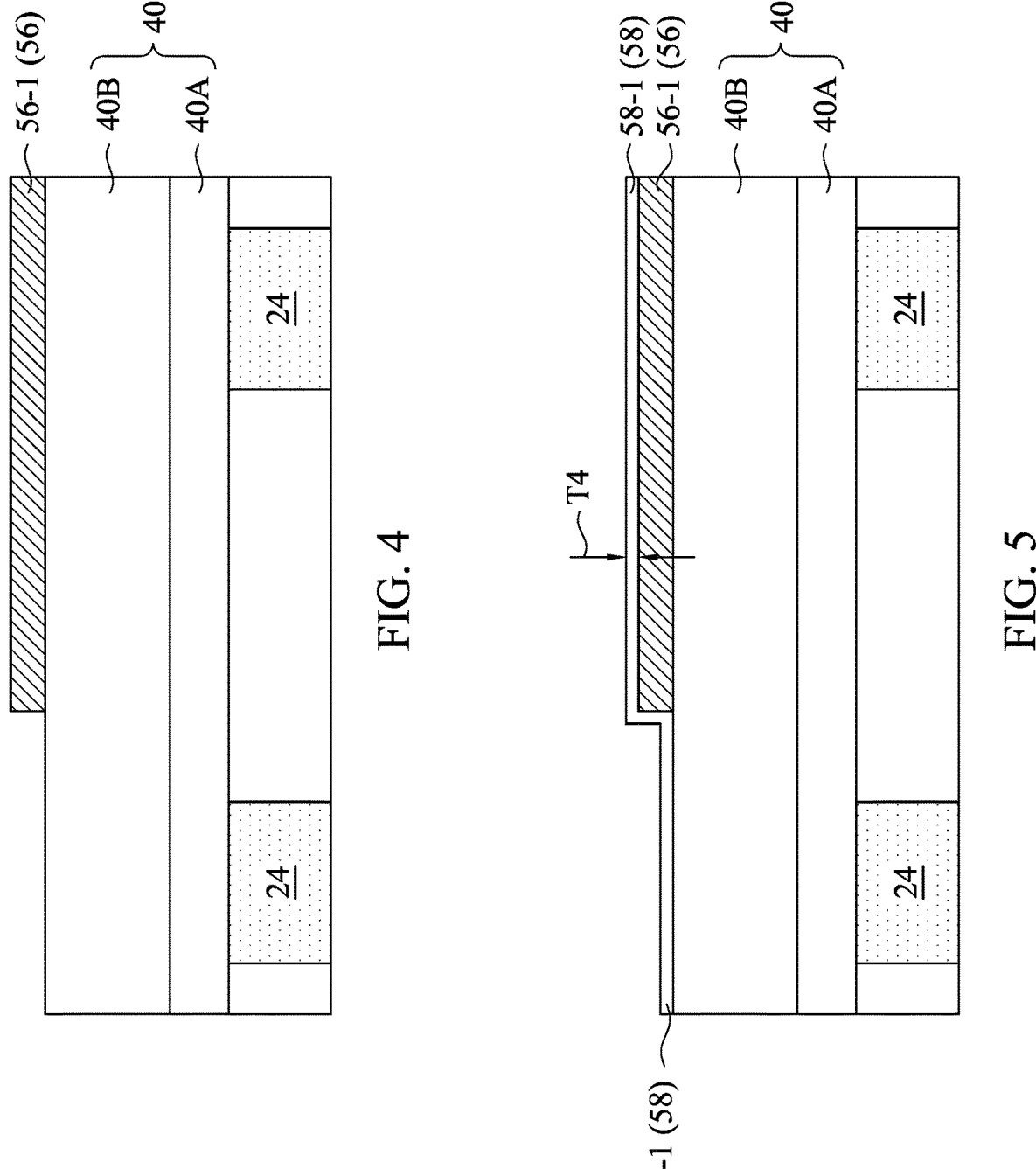

FIG. 5 illustrates the formation of capacitor insulator 58-1. The respective process is illustrated as process 206 in the process flow 200 as shown in FIG. 24. In accordance with some embodiments, capacitor insulator 58-1 is a composite layer including a plurality of sub-layers, which may include aluminum oxide ($Al_2O_3$), zirconium oxide ($ZrO_2$), hafnium oxide ($HFO_2$), and the like. The formation process may include ALD, CVD, or the like. The thickness T4 of capacitor insulator 58-1 may be in the range between about 50 Å and about 100 Å. The detailed formation processes are discussed referring to the processes as shown in FIGS. 15 through 23.

Figure 6:
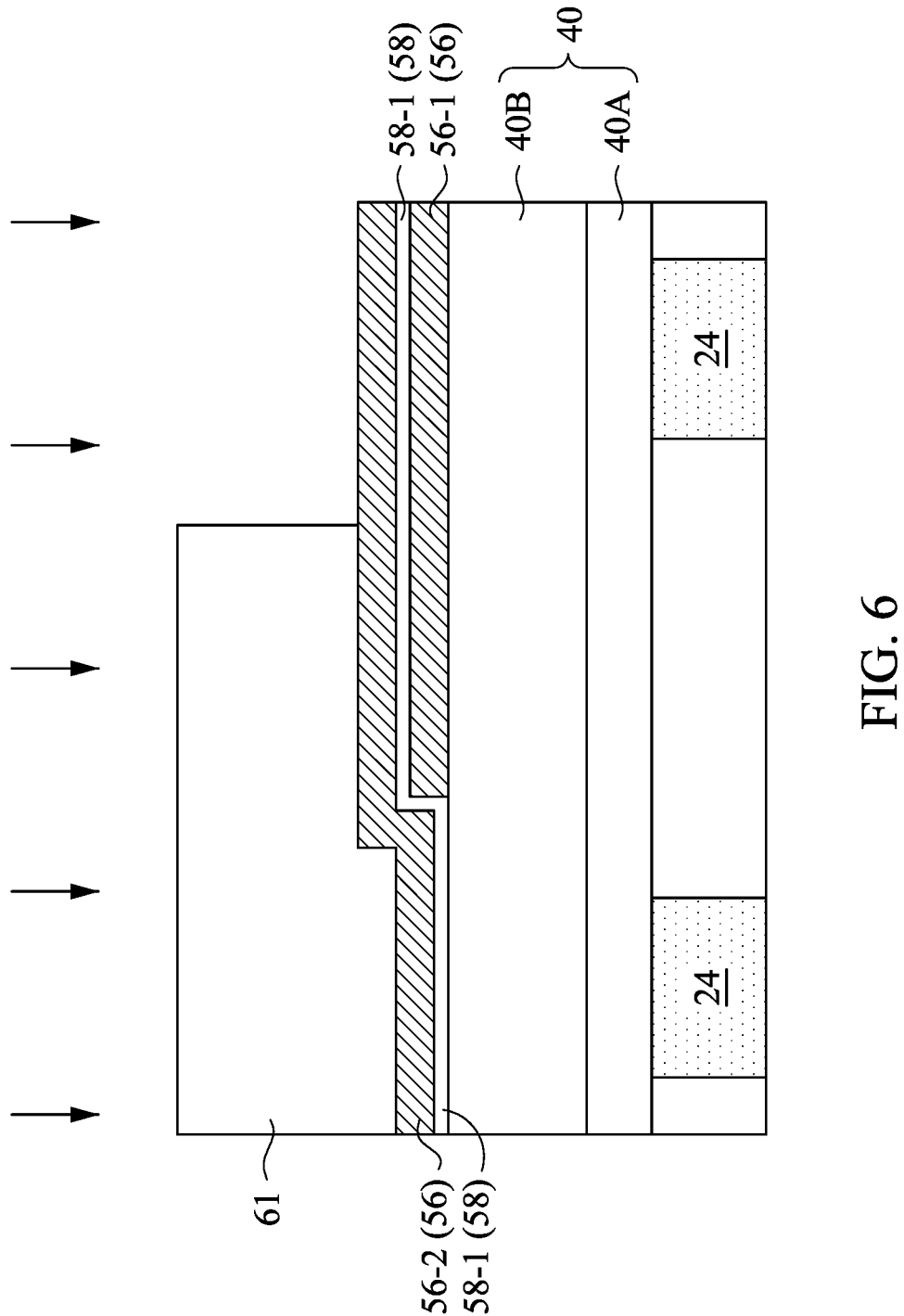

Referring to FIG. 6, capacitor electrode 56-2 is deposited as a blanket layer. The respective process is illustrated as process 208 in the process flow 200 as shown in FIG. 24. In accordance with some embodiments, capacitor electrode 56-2 is formed of or comprise the similar material (such as TiN or TaN), and may have a same or a similar thickness, as bottom capacitor electrode 56-1. A patterned etching mask 61 is then formed, which may include a photoresist. Capacitor electrode 56-2 is then etched using the etching mask 61 to define the patterns. The respective process is illustrated as process 210 in the process flow 200 as shown in FIG. 24. In the etching of capacitor electrode 56-2, capacitor insulator 58-1 is used as an etch stop layer. Since capacitor insulator 58-1 includes multiple sub-layers, the etching may be stopped on the top sub-layer in capacitor insulator 58-1. Etching mask 61 is then removed. The resulting structure is shown in FIG. 7.

Figures 7, 8:
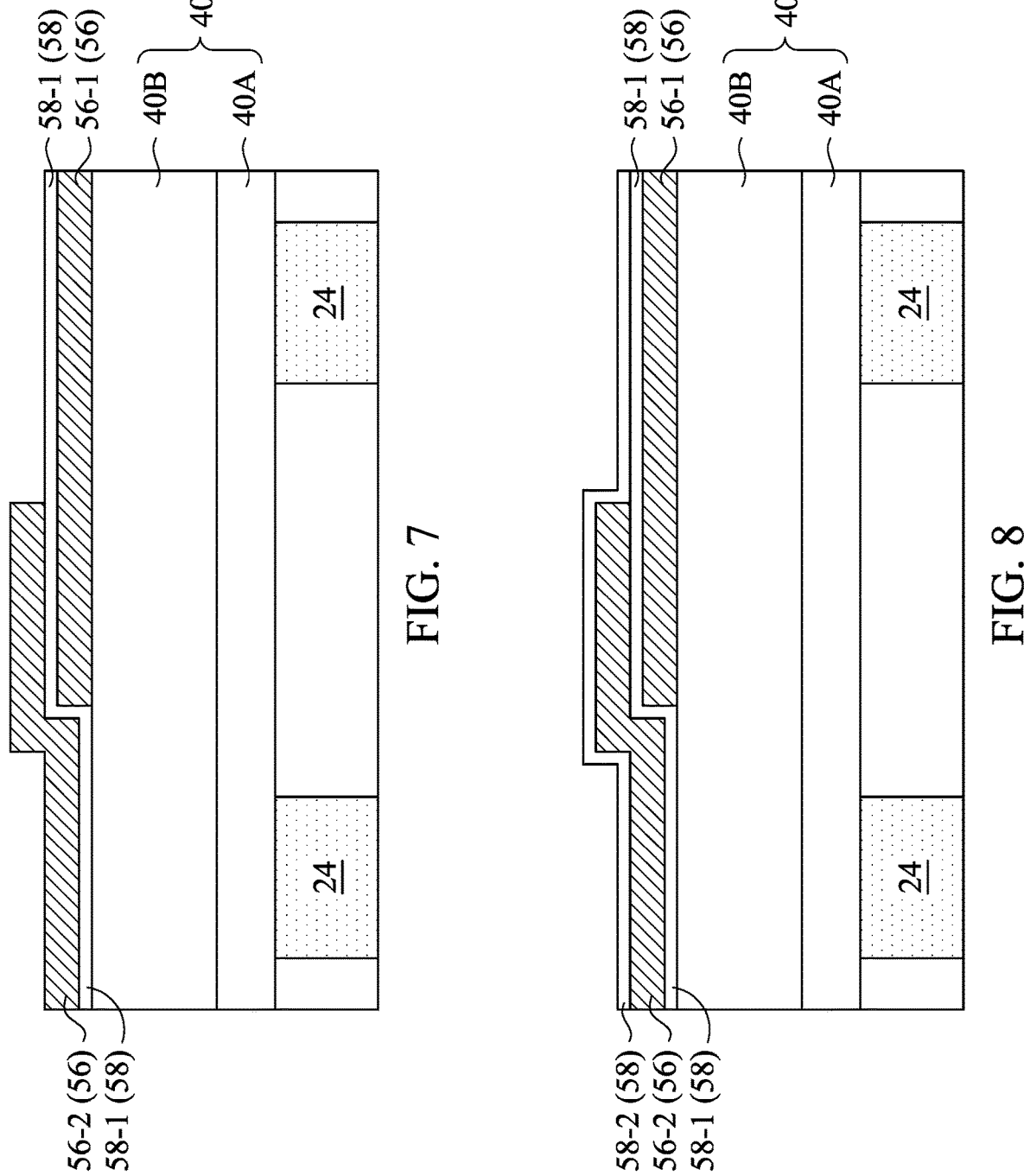

Referring to FIG. 8, capacitor insulator 58-2 is formed. The respective process is illustrated as process 212 in the process flow 200 as shown in FIG. 24. In accordance with some embodiments, capacitor insulator 58-2 has a multi-layer structure including a plurality of sub-layers. The structure and the formation process may also be found referring to FIGS. 15 through 23 and the related discussion.

Figure 9:
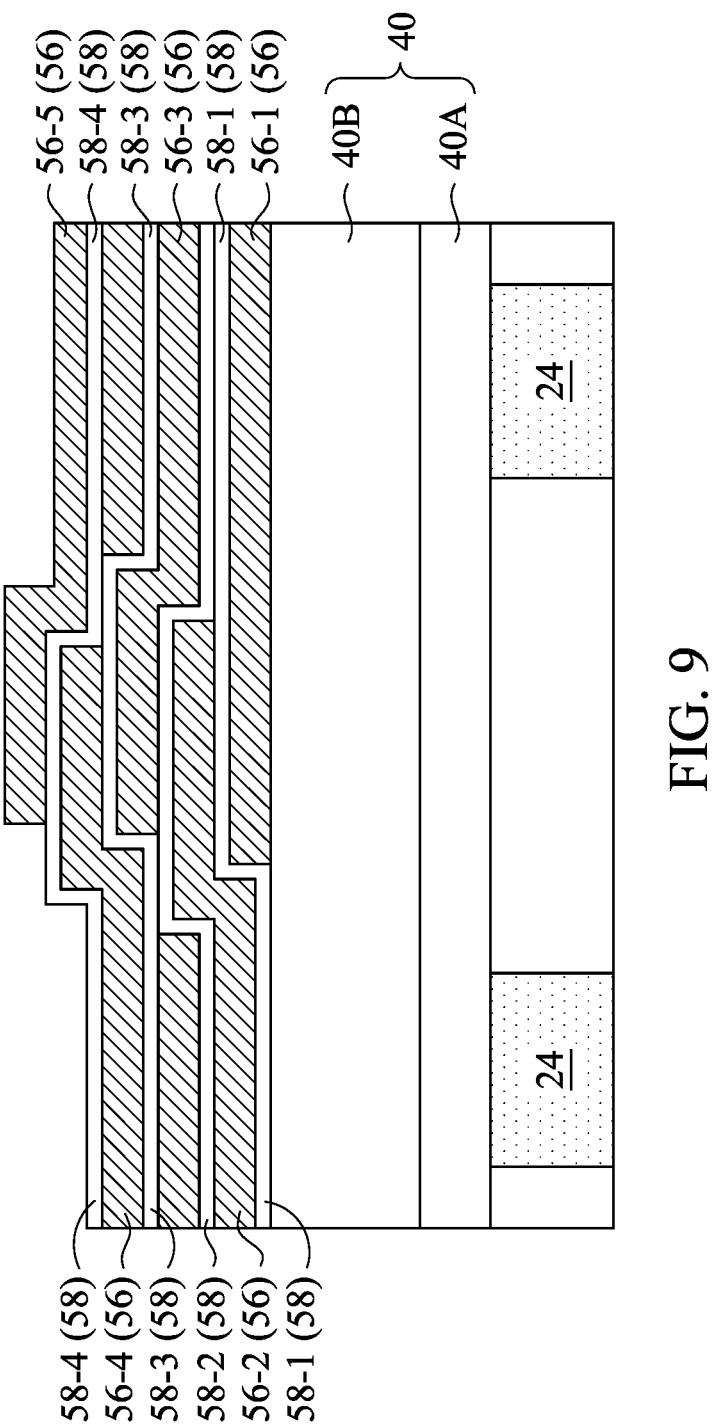

FIG. 9 illustrates the formation of more capacitor electrodes (such as capacitor electrodes 56-3, 56-4, and 56-5) and more capacitor insulators (such as capacitor insulators 58-3 and 58-4). The respective process is illustrated as process 214 in the process flow 200 as shown in FIG. 24. It is appreciated that the structure illustrated in FIG. 9 is an example, and the formed capacitor may include more or fewer capacitor electrodes and capacitor insulators. The formation of capacitor electrodes 56-3, 56-4, and 56-5 may be the same or similar to the formation of capacitor electrode 56-1. The formation of capacitor insulators 58-3 and 58-4 may be the same or similar to the formation of capacitor insulator 58-1, which may be found referring to FIGS. 15 through 23. Throughout the description, capacitor electrodes 56-1, 56-2, 56-3, 56-4, and 56-5 are collectively and individually referred to as capacitor electrodes 56. Capacitor insulators 58-1, 58-2, 58-3, and 58-4 are collectively and individually referred to as capacitor insulators 58.

Figure 10:
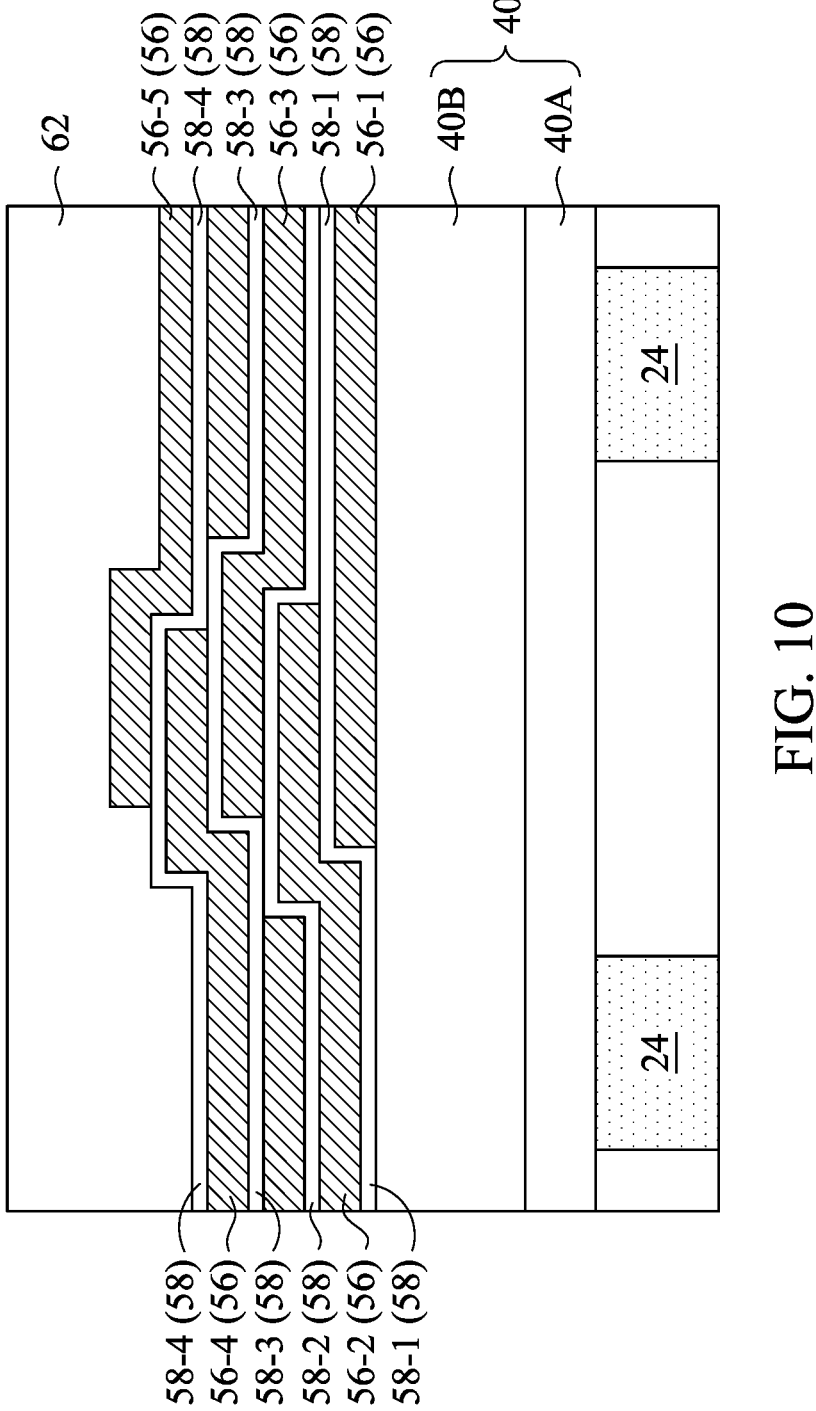

Next, as shown in FIG. 10, dielectric layer 62 is deposited. The respective process is illustrated as process 216 in the process flow 200 as shown in FIG. 24. In accordance with some embodiments, dielectric layer 62 is formed of or comprises silicon nitride, silicon oxide, silicon oxynitride, silicon oxycarbide, or the like. The thickness of dielectric layer 62 may be in the range between about 5 kÅ and about 10 kÅ. In accordance with alternative embodiments, dielectric layer 62 may be formed of a low-k dielectric material when the resulting capacitor is one of capacitors 46A and 46B (FIG. 1). In accordance with yet alternative embodiments, dielectric layer 62 may be polymer layer 36 or 42 in the embodiments shown in FIG. 1. After the deposition of dielectric layer 62, a planarization process such as a Chemical Mechanical Polish (CMP) process or a mechanical grinding process is performed, so that the top surface of dielectric layer 62 is planar. The respective process is illustrated as process 218 in the process flow 200 as shown in FIG. 24.

Figure 11:
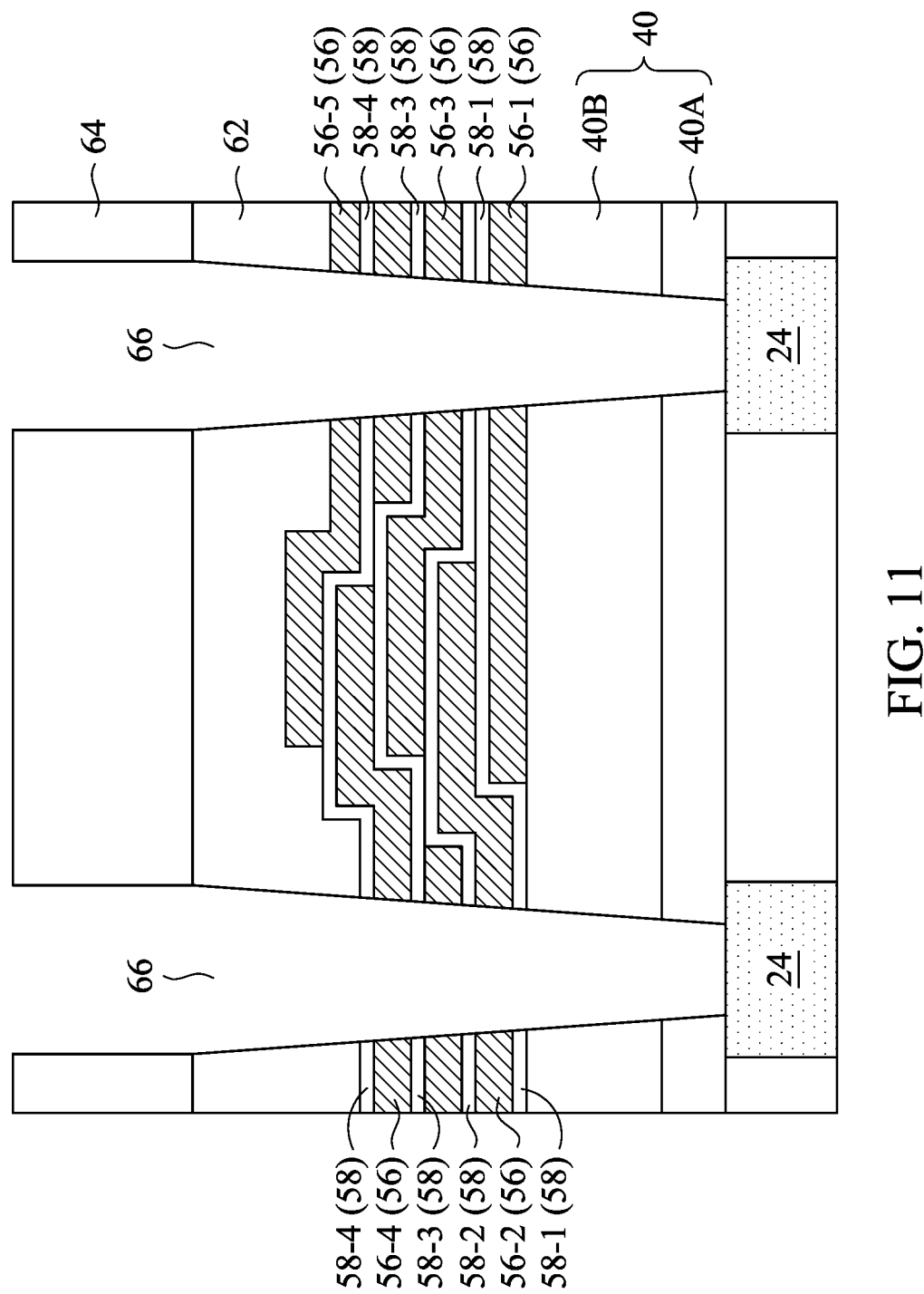

Referring to FIG. 11, a photo lithography process is performed. Etching mask 64 is first formed. In accordance with some embodiments, etching mask 64 comprises a photoresist, and may include anti-reflective coating therein. Etching mask 64 may have a single-layer structure, a dual-layer structure, a tri-layer structure, or the like. Next, etching processes are performed to etch dielectric layer 62, capacitor electrodes 56-1, 56-2, 56-3, 56-4, 56-5, and capacitor insulators 58-1, 58-2, 58-3, and 58-4. Contact openings 66 are formed, and dielectric layer 40B is revealed to contact openings 66. The respective process is illustrated as process 220 in the process flow 200 as shown in FIG. 24.

The etching of capacitor electrodes 56-1, 56-2, 56-3, 56-4, 56-5 may use the similar etching chemicals (such as gases or chemical solutions) as what is used for patterning capacitor electrode 56-2. For example, chlorine-based gas such as TiClx, TaClx, WClx, chlorine ($Cl_2$), and/or the like, fluorine-containing gas such as $CHF_3$, $CF_4$, or the like, or combinations of these gases, may be used if dry etching processes are used. The mixture of $NH_4OH$ and $H_2O_2$, the mixture of $H_2O_2$ and $H_2O$, and/or the like may be used when wet etching processes are used.

The etching of capacitor insulators 58-1, 58-2, 58-3, and 58-4 may adopt HBr, $BCl_3$, $Cl_2$, $CF_4$, $CH_4$, $C_4F_8$, $CHF_3$, $SF_6$, $O_2$, and/or the like when dry etching is used, depending on the specific material of capacitor insulators 58-1, 58-2, 58-3, and 58-4. When wet etching processes are adopted, phosphoric acid solution, HF solution, and/or the like may be used.

The etching is further continued to etch through dielectric layers 40A and 40B. The etching of dielectric layers 40A and 40B may be performed through a dry etching process. The etching gas may include a fluorine-containing gas such as $CF_4$, $NF_3$, $SF_6$, $CHF_3$, or combinations thereof. Other gases such as $O_2$, $N_2$, $H_2$, Ar, NO, and the like, or combinations thereof may also be added. A bias power is applied, so that the etching is anisotropic. After the etching process, conductive features 24 are exposed to contact openings 66. Etching mask 64 is then removed.

Figure 12:
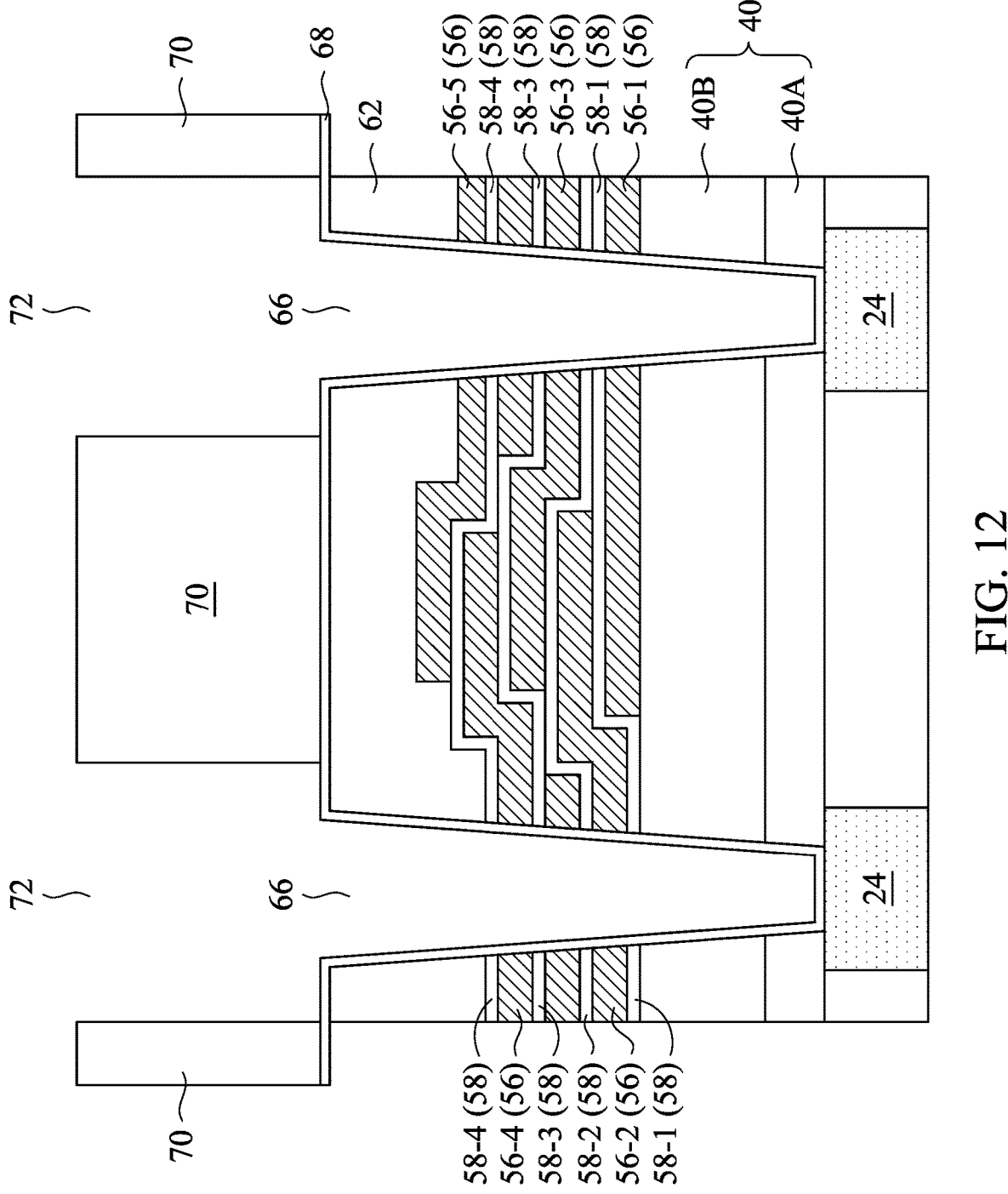

FIG. 12 illustrates the deposition of metal seed layer 68. The respective process is illustrated as process 222 in the process flow 200 as shown in FIG. 24. In accordance with some embodiments, metal seed layer 68 comprises a titanium layer and a copper layer over the titanium layer. In accordance with alternative embodiments, metal seed layer 68 comprises a copper layer in contact with dielectric layer 62. The deposition process may be performed using Physical Vapor Deposition (PVD), CVD, Metal Organic Chemical Vapor Deposition (MOCVD), or the like.

FIG. 12 further illustrates the formation of patterned plating mask 70. The respective process is illustrated as process 224 in the process flow 200 as shown in FIG. 24. In accordance with some embodiments, plating mask 70 is formed of or comprises photoresist. Openings 72 are formed in the patterned plating mask 70 to reveal metal seed layer 68.

Figure 13:
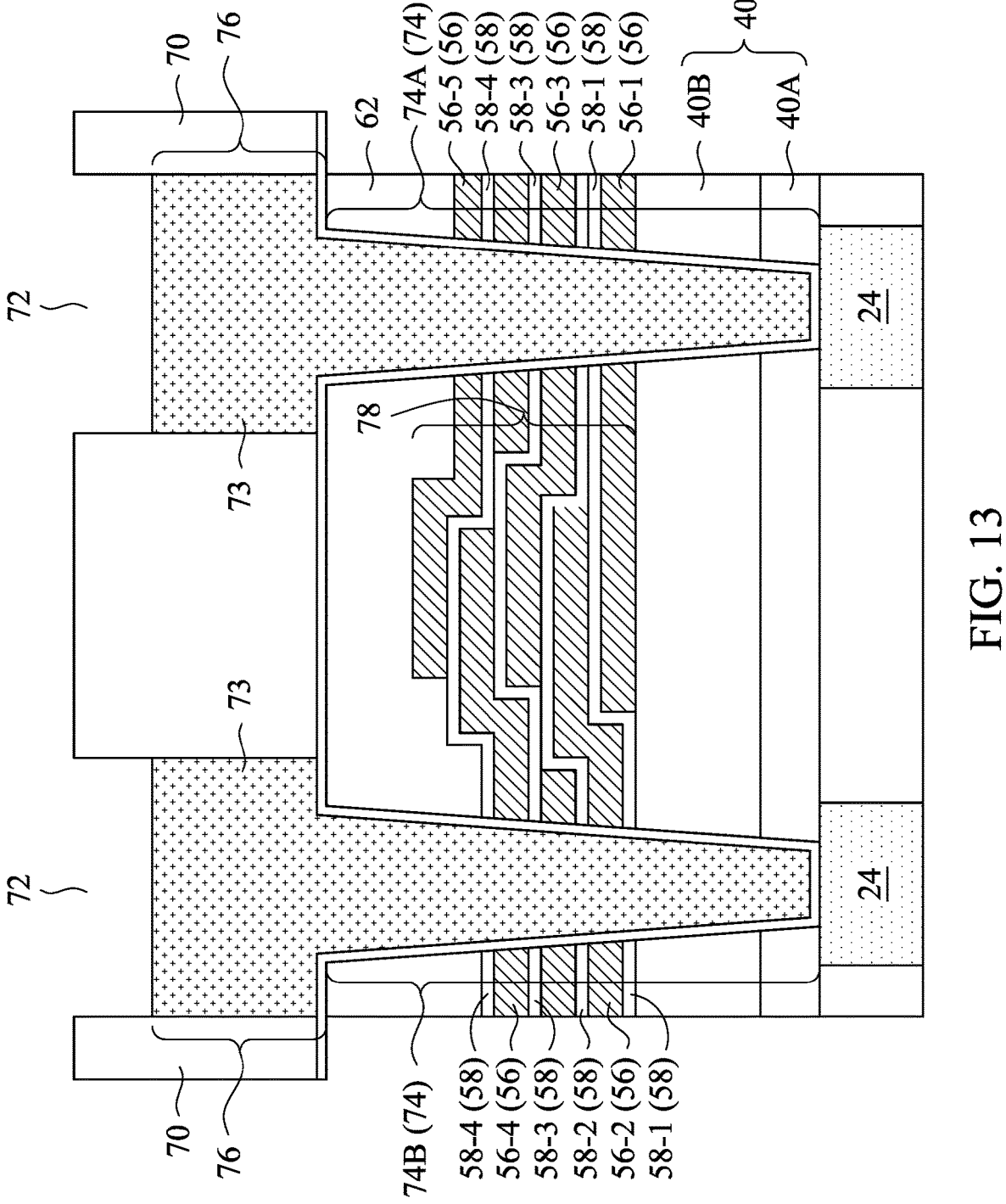

FIG. 13 illustrates the formation of conductive material 73 into openings 72 and on metal seed layer 68. Contact plugs 74 and conductive lines 76 are thus formed. The respective process is illustrated as process 226 in the process flow 200 as shown in FIG. 24. In accordance with some embodiments, the formation of conductive material 73 includes a plating process, which may include an electrochemical plating process, an electroless plating process, or the like. Conductive material 73 may include copper, aluminum, nickel, tungsten, or the like, or alloys thereof.

Figure 14:
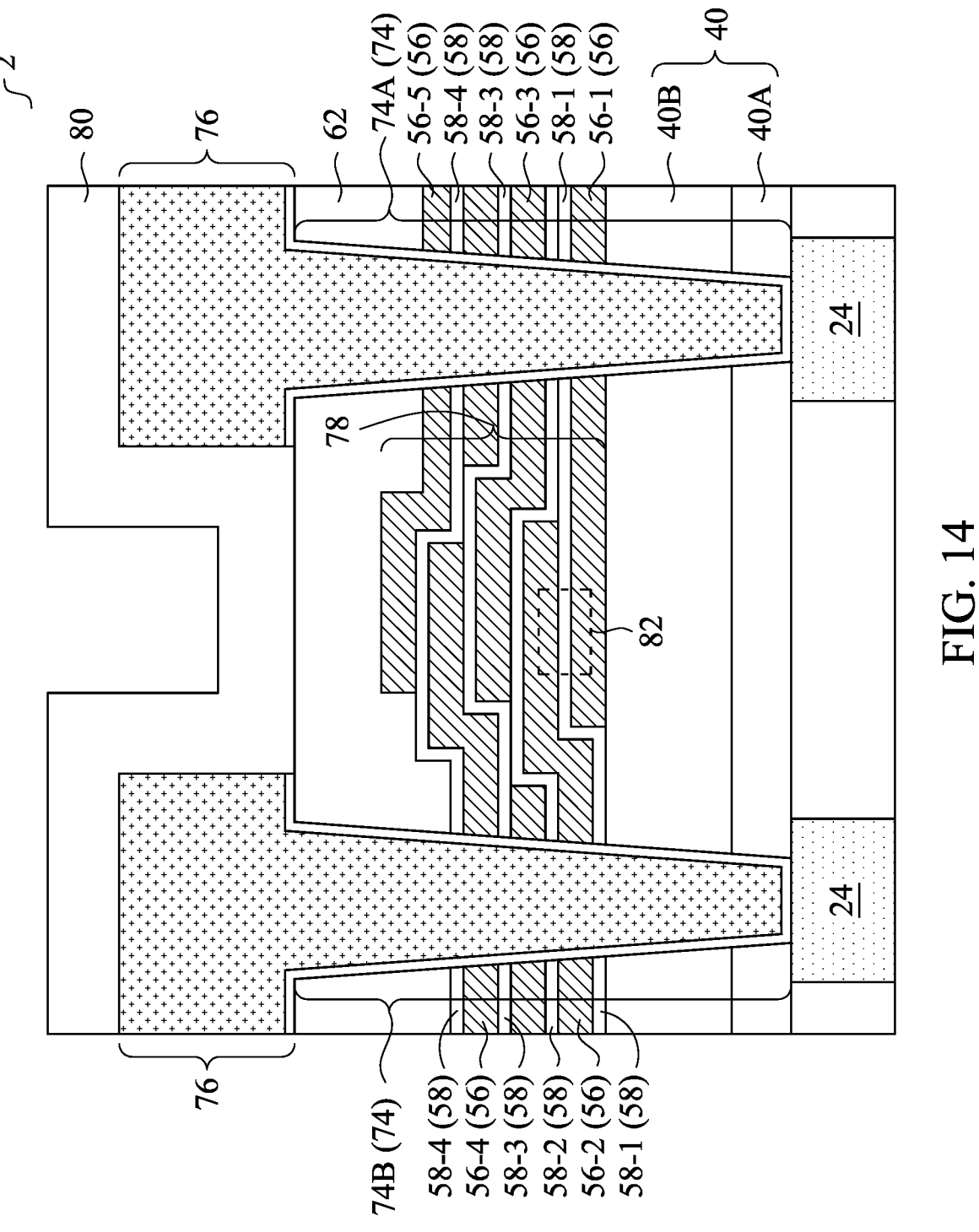

Next, the plating mask 70 as shown in FIG. 13 is removed. In a subsequent process, an etching process is performed to remove the portions of metal seed layer 68 that are not protected by the overlying contact plugs 74 and conductive lines 76. The resulting structure is also shown in FIG. 14. The remaining metal seed layer 68 becomes parts of contact plugs 74 and conductive lines 76. Contact plugs 74 include contact plugs 74A and 74B.

Contact plug 74A is electrically connected to, and electrically shorts, capacitor electrodes 56-1, 56-3, and 56-5. Contact plug 74B is electrically connected to, and electrically shorts, capacitor electrodes 56-2 and 56-4. Accordingly, capacitor 78 is formed, which include capacitor electrodes 56-1, 56-3, and 56-5 collectively as a first capacitor electrode, and capacitor electrodes 56-2 and 56-4 collectively as a second capacitor electrode.

FIG. 14 further illustrates the formation of dielectric layer 80. The respective process is illustrated as process 228 in the process flow 200 as shown in FIG. 24. In accordance with some embodiments, dielectric layer 80 is a passivation layer, which may be formed of or comprises silicon nitride, silicon oxide, silicon oxynitride, silicon oxycarbide, or the like, or multi-layers thereof. The thickness of dielectric layer 80 may be in the range between about 8 kÅ and about 20 kÅ. In accordance with alternative embodiments, dielectric layer 80 may be formed of a low-k dielectric material when the resulting capacitor is one of capacitors 46A or 46B (FIG. 1). In accordance with yet alternative embodiments, passivation layer 80 may be polymer layer 36 or 42 in the embodiments shown in FIG. 1.

Figure 25:
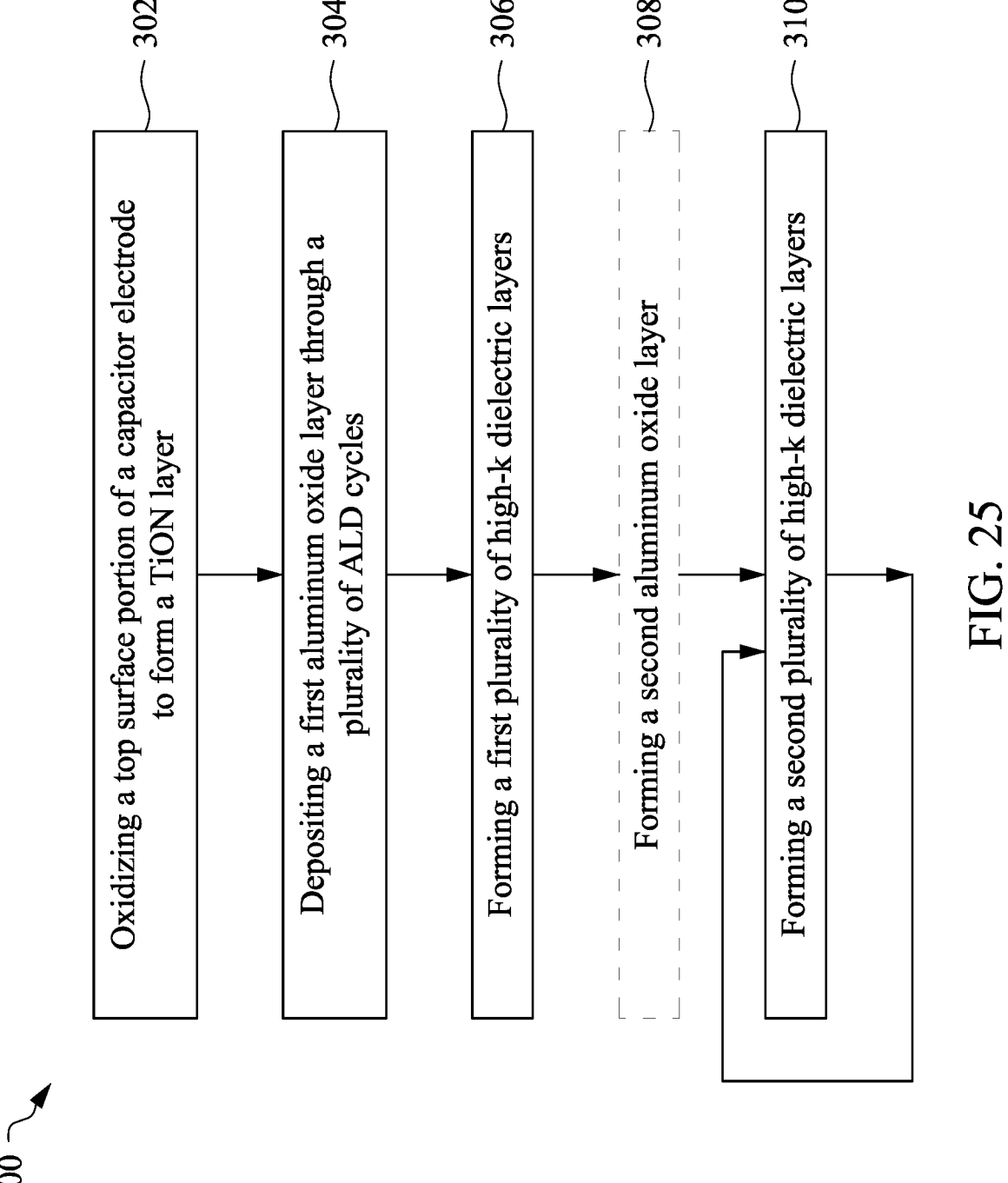
FIG. 25 illustrates a process flow for forming a capacitor insulator in accordance with some embodiments.

FIGS. 15 through 21 illustrate the formation of capacitor insulators 58-1, 58-2, 58-3, and/or 58-4 in accordance with some embodiments. The structure shown in FIG. 21 may be a magnified view of the structure in region 82 in FIG. 14. Accordingly, the formation of capacitor insulator 58-1 is used as an example, while the formation process of capacitor insulator 58-1 may also be used for the formation of capacitor insulators 58-2, 58-3, and 58-4. The processes shown in FIGS. 15 through 21 are also illustrated in process flow 300 as shown in FIG. 25. Furthermore, process flow 300 illustrates the detailed processes in the processes 206, 212, and 214 in the process flow 200.

Figures 15, 16:
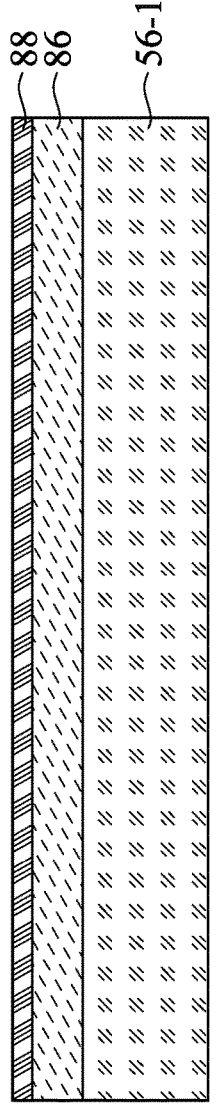
FIGS. 15 through 21 illustrate the cross-sectional views of intermediate stages in the formation of a capacitor insulator in a MIM capacitor in accordance with some embodiments.

Referring to FIG. 15, capacitor electrode 56-1 is deposited. In accordance with some embodiments as aforementioned, capacitor electrode 56-1 comprises TiN. Accordingly, the subsequent discussion uses TiN as an example, while capacitor electrode 56-1 may be formed of other conductive materials such as TaN. An oxidation process 84 is then performed. The respective process is illustrated as process 302 in the process flow 300 as shown in FIG. 25. The oxidation process may be performed using an oxygen-containing process gas such as oxygen ($O_2$), water steam ($H_2O$), or the like. The oxidation process may be performed at a temperature in the range between about 250° C. and about 400° C. The oxidation duration may be in the range between about 5 seconds and about 60 seconds. As a result of the oxidation, a top surface layer of capacitor electrode 56-1 is oxidized, and TiN is converted into an TiON layer 86, which is also referred to as an oxide-containing layer. In accordance with some embodiments, TiON layer 86 has a thickness T5 in the range between about 5 Å and about 40 Å.

Next, referring to FIG. 16, high-bandgap dielectric layer 88 is deposited. In accordance with some embodiments, high-bandgap dielectric layer 88 comprises aluminum oxide, which has the bandgap in the range between about 7.0 eV and about 9.0 eV. Accordingly, high-bandgap dielectric layer 88 is referred to as aluminum oxide layer 88 throughout the description, while other high-bandgap dielectric materials may also be used. The respective process is illustrated as process 304 in the process flow 300 as shown in FIG. 25. In accordance with some embodiments, aluminum oxide layer 88 is deposited using ALD, which is free from plasma. The precursor may comprise Trimethylaluminum (TMA) and water steam ($H_2O$). An ALD cycle for depositing an aluminum oxide atomic layer may include pulsing TMA, purging TMA, pulsing $H_2O$, and purging $H_2O$. The purging gas may include an inert gas such as nitrogen ($N_2$), argon, or the like. The wafer temperature for depositing aluminum oxide layer 88 may be in the range between about 220° C. and about 330° C. Aluminum oxide layer 88 is formed as an amorphous layer in accordance with some embodiments.

The duration for pulsing TMA may be in the range between about 0.3 seconds and about 2 seconds. The chamber pressure in the pulsing of TMA may be in the range between about 0.1 Torr and about 100 Torr. The duration for purging TMA may be in the range between about 1 second and about 3 seconds. The chamber pressure in the purging of TMA may be in the range between about 0.1 Torr and about 100 Torr. The duration for pulsing $H_2O$ may be in the range between about 0.3 seconds and about 5 seconds. The chamber pressure in the pulsing of $H_2O$ may be in the range between about 0.1 Torr and about 100 Torr. The duration for purging $H_2O$ may be in the range between about 1 second and about 3 seconds. The chamber pressure in the purging of $H_2O$ may be in the range between about 0.1 Torr and about 100 Torr.

The deposition of aluminum oxide layer 88 includes at least two, and may be more ALD cycles such as three cycles, four cycles, five cycles, or more. Depositing aluminum oxide layer 88 with an ALD cycle number greater than 2 or more may result in thicker aluminum oxide layer 88, which is advantageous in improving the reliability of the resulting capacitor, as will be discussed in detail in subsequent paragraphs.

Figures 17, 18:
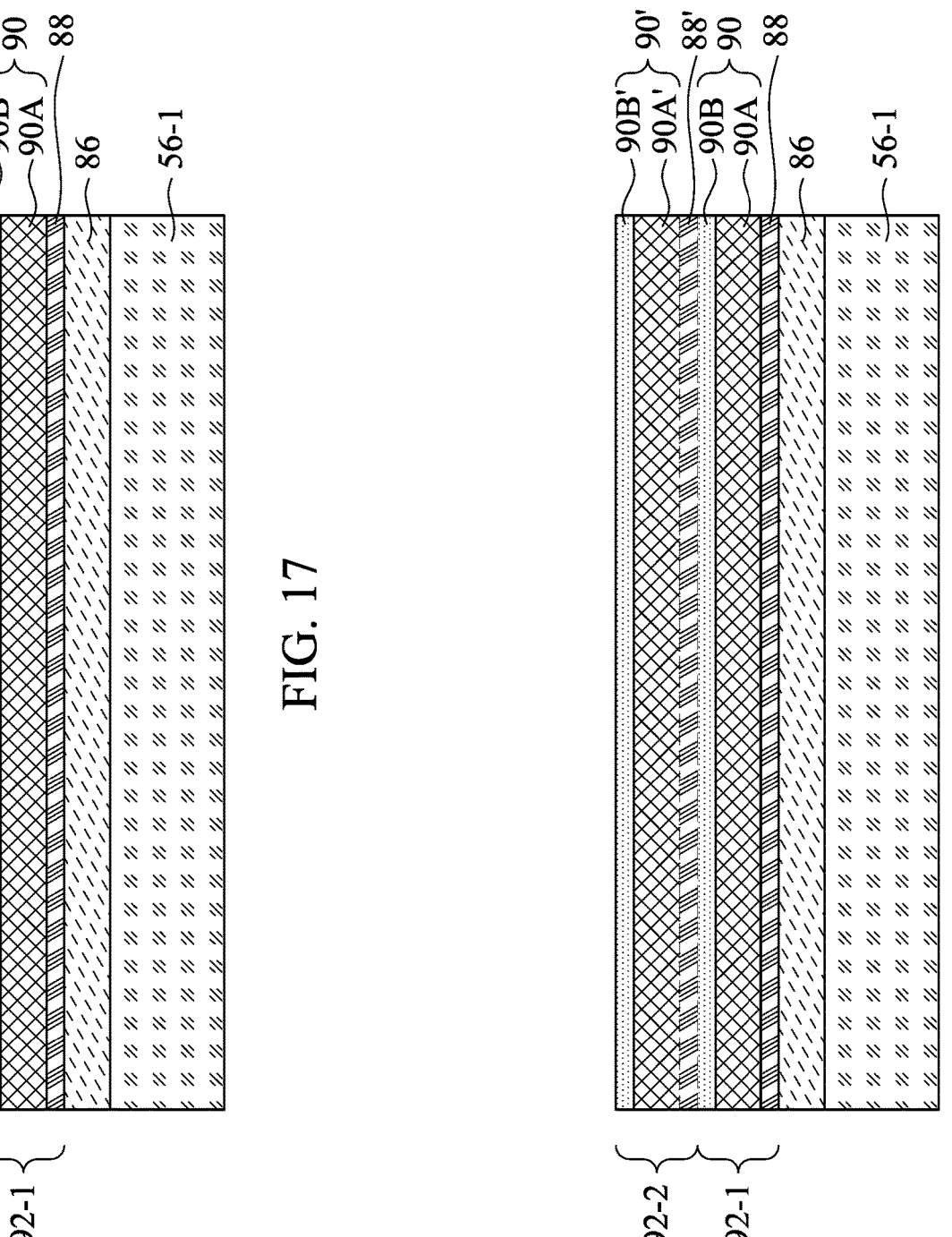

Next, referring to FIG. 17, high-k dielectric layers 90 that have high dielectric constant values (k values) are formed. The respective process is illustrated as process 306 in the process flow 300 as shown in FIG. 25. In accordance with some embodiments, high-k dielectric layers 90 include two or more dielectric layers formed of different dielectric materials. For example, high-k dielectric layers 90 may include zirconium oxide ($ZrO_2$) layer 90A (with k value of about 25), and hafnium oxide ($HfO_2$) layer 90B (also with k value of about 25) over $ZrO_2$ layer 90A. The high k values of high-k dielectric layers 90 are used to achieve high capacitance values of the resulting capacitor.

In accordance with some embodiments, zirconium oxide layer 90A is deposited using ALD, which is free from plasma. In accordance with some embodiments, the precursor may comprise $ZrCl_4$ and water steam ($H_2O$). An ALD cycle for depositing a zirconium oxide atomic layer includes pulsing $ZrCl_4$, purging $ZrCl_4$, pulsing $H_2O$, and purging $H_2O$. The purging gas may include an inert gas such as nitrogen ($N_2$), argon, or the like. The wafer temperature for depositing zirconium oxide layer 90A may be in the range between about 220° C. and about 330° C.

The duration for pulsing $ZrCl_4$ may be in the range between about 0.3 seconds and about 2 seconds. The chamber pressure in the pulsing of $ZrCl_4$ may be in the range between about 0.1 Torr and about 100 Torr. The duration for purging $ZrCl_4$ may be in the range between about 1 second and about 3 seconds. The chamber pressure in the purging of $ZrCl_4$ may be in the range between about 0.1 Torr and about 100 Torr. The duration for pulsing $H_2O$ may be in the range between about 0.3 seconds and about 5 seconds. The chamber pressure in the pulsing of $H_2O$ may be in the range between about 0.1 Torr and about 100 Torr. The duration for purging $H_2O$ may be in the range between about 1 second and about 3 seconds. The chamber pressure in the purging of $H_2O$ may be in the range between about 0.1 Torr and about 100 Torr.

The deposition of zirconium oxide layer 90A includes one or more ALD cycles to reach the desirable thickness. In accordance with some embodiments, the ALD cycle number for depositing zirconium oxide layer 90A may be in the range between about 4 and 10.

In accordance with some embodiments, hafnium oxide layer 90B is deposited using ALD, which is also free from plasma. In accordance with some embodiments, the precursor may comprise $HfCl_4$ and water steam ($H_2O$). In accordance with some embodiments, an ALD cycle for depositing a hafnium oxide layer includes pulsing $HfCl_4$, purging $HfCl_4$, pulsing $H_2O$, and purging $H_2O$. The purging gas may include an inert gas such as nitrogen ($N_2$), argon, or the like. The wafer temperature for depositing hafnium oxide layer 90B may be in the range between about 220° C. and about 330° C.

The duration for pulsing $HfCl_4$ may be in the range between about 0.3 seconds and about 2 seconds. The chamber pressure in the pulsing of $HfCl_4$ may be in the range between about 0.1 Torr and about 100 Torr. The duration for purging $HfCl_4$ may be in the range between about 1 second and about 3 seconds. The chamber pressure in the purging of $HfCl_4$ may be in the range between about 0.1 Torr and about 100 Torr. The duration for pulsing $H_2O$ may be in the range between about 0.3 seconds and about 5 seconds. The chamber pressure in the pulsing of $H_2O$ may be in the range between about 0.1 Torr and about 100 Torr. The duration for purging $H_2O$ may be in the range between about 1 second and about 3 seconds. The chamber pressure in the purging of $H_2O$ may be in the range between about 0.1 Torr and about 100 Torr.

The deposition of hafnium oxide layer 90B includes one or more ALD cycles to reach the desirable thickness. In accordance with some embodiments, the ALD cycle number for depositing hafnium oxide layer 90B may be in the range between about 1 and 5.

It is appreciated that high-k dielectric layers 90A and 90B contribute to the high k value, and hence contribute to the increase in the capacitance value of the resulting capacitance. On the other hand, to reduce the leakage current and to improve the dielectric breakdown voltage of the capacitance insulator, a high bandgap dielectric layer 88 is adopted. For example, aluminum oxide has the bandgap in the range between about 7.0 eV and about 9.0 eV, which is significantly higher than the bandgap of about 5.8 eV of the zirconium oxide and hafnium oxide. Furthermore, aluminum oxide has good ability for preventing oxygen from diffusing-through to cause re-oxidation of TiN. Aluminum oxide layer, on the other hand, cannot be too thick. Otherwise, it will cause too much reduction in the overall k value of the capacitance insulator. Accordingly, an explicit thinking is to have one atomic layer (through one ALD) cycle of aluminum oxide to have maximized benefit without reducing k value significant.

Experiments have been performed, and the results have revealed that increasing the thickness of aluminum oxide layer 88 may improve the reliability of the resulting capacitor. The reliability issue may be related to the re-oxidation of TiN at the interface of TiN (capacitor electrode 56-1) and the TiON layer 86. For example, in the subsequent patterning of the TiN layer 56-2 (FIG. 5), plasma may be generated from the etching gas. The plasma energy may cause oxygen (for example, in TiON or outside environment) to diffuse through aluminum oxide layer 88 and TiON layer 86, and hence a top surface layer of TiN is oxidized again (re-oxidation). This may cause the peeling of the TiON layer 86 from capacitor electrode 56-1.

Experiments have revealed that when the aluminum oxide layer 88 is formed through one ALD cycle, the I-V curves of the multiple corresponding sample capacitors are not consistent, and some samples have high leakage currents. This may be because the thin aluminum oxide layer 88 is not thick enough to block oxygen from diffusing through it. When the thickness of the aluminum oxide layer 88 increases, for example, to two ALD layers or more, the leakage is reduced, and the I-V curves of the multiple sample capacitors are more consistent.

Some experiments have revealed that when the ALD cycles for forming aluminum oxide layer 88 is equal to four, the corresponding sample capacitors have consistent I-V curves, and the leakage current is very low. The leakage current may be reduced by two-orders. Accordingly, the formation of aluminum oxide layer 88 includes at least two ALD cycles, and may be three, four, five, or more ALD cycles. Thicker aluminum oxide layer 88 also form thicker intermixing layer with the underlying TiON layer 86, and the adhesion of TiON layer 86 and the corresponding intermixing layer to the underlying TiN layer is improved. Also, thicker intermixing layer has better diffusion-blocking ability.

In accordance with some embodiments, experiments may be performed to determine optimum ALD cycle number for forming aluminum oxide layer 88. In the experiments, a plurality of groups of sample capacitors are formed, with the ALD cycle numbers of the plurality of groups of sample capacitors being different from each other. For example, some groups of sample capacitors may be formed with ALD cycle number of the aluminum oxide layer 88 being equal to 2, while some other groups of sample capacitors may be formed with the ALD cycle numbers being equal to 3, 4, 5, 6, or greater. The I-V curves the sample capacitors are measured to determine the minimum ALD cycle number that can achieve stable I-V curves and low leakage. The determined minimum ALD cycle number is then used in the mass production. In some experiments, the minimum ALD cycle number for forming aluminum oxide layer 88 have found to be in the range between about 2 and about 5.

The aluminum oxide layer 88, zirconium oxide layer 90A, and hafnium oxide layer 90B in combination form dielectric layer-stack 92-1. FIG. 18 illustrates the formation of dielectric layer-stack 92-2. In accordance with some embodiments, dielectric layer-stack 92-2 includes aluminum oxide layer 88' and high-k dielectric layers 90'. In accordance with alternative embodiments, dielectric layer-stack 92-2 includes dielectric layers 90', and does not include aluminum oxide layer 88'. Accordingly, aluminum oxide layer 88' is shown as being dashed to indicate it may or may not be formed. When aluminum oxide layer 88' is formed, it may be formed with an ALD cycle number smaller than the ALD cycle number for forming aluminum oxide layer 88. The respective process is illustrated as process 308 in the process flow 300 as shown in FIG. 25.

The reason that aluminum oxide layer 88' may adopt a smaller ALD cycle number than aluminum oxide layer 88 is because aluminum oxide layer 88' is not resided immediately on TiON and TiN. Accordingly, there is no re-oxidation and peeling issue in the layers immediately underlying aluminum oxide layer 88'. Also, aluminum oxide layer 88' cannot form any intermixing layer with the non-existent TiON. The thickness of aluminum oxide layer 88' thus does not affect the reliability (and cannot affect the peeling) of the resulting capacitor. In accordance with some embodiments, aluminum oxide layer 88' is formed through a single ALD cycle. Alternatively, aluminum oxide layer 88' may be formed using any ALD cycle number that is smaller than the cycle number for forming aluminum oxide layer 88. Accordingly, aluminum oxide layer 88 is thicker than aluminum oxide layer 88' (if formed) in accordance with some embodiments.

After the formation of aluminum oxide layer 88', high-k dielectric layers 90' are formed. The respective process is illustrated as process 310 in the process flow 300 as shown in FIG. 25. In accordance with some embodiments, there is a single dielectric layer-stack 92-2 formed. In accordance with alternative embodiments, there are more dielectric layer-stacks 92-2 identical to the illustrated dielectric layer-stack 92-2 formed. The additional illustrated dielectric layer-stacks 92-2, if formed, are stacked on the illustrated dielectric layer-stack 92-2. The formation of the additional illustrated dielectric layer-stacks 92-2 is shown by looping the process back to process 310.

Figure 19:
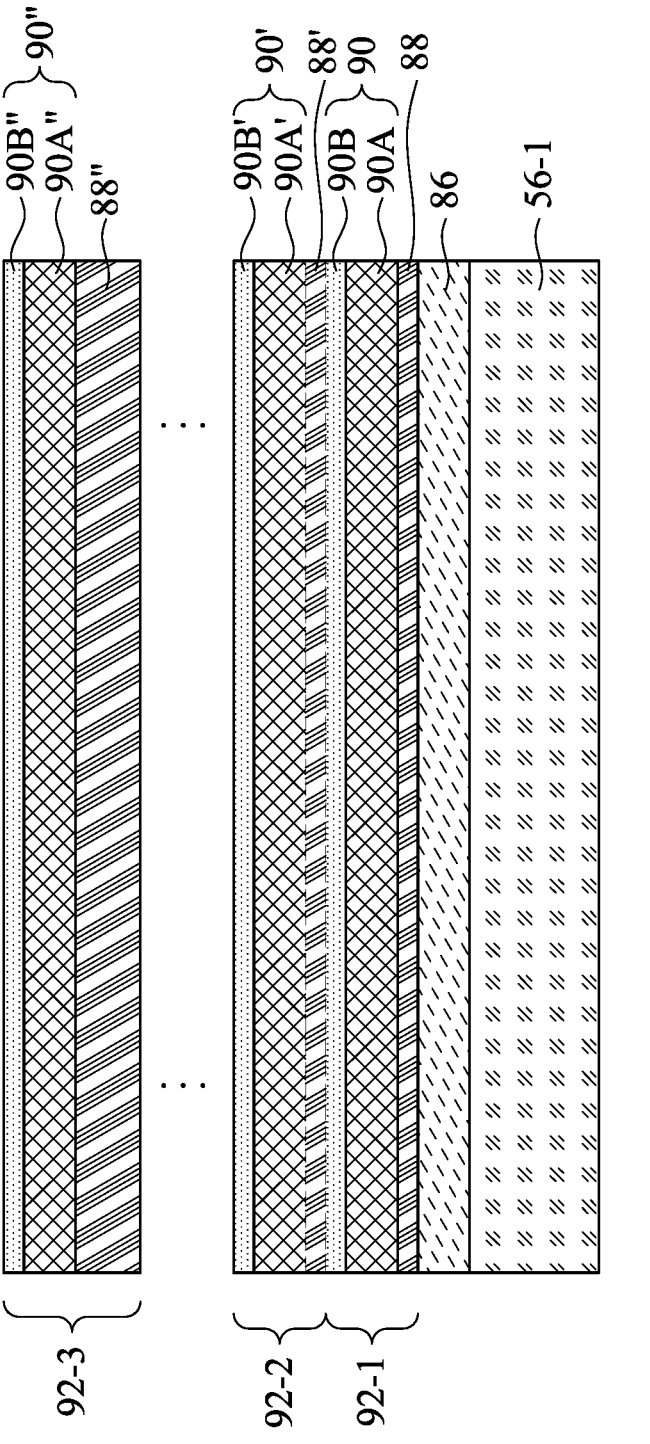

FIG. 19 illustrates the formation of dielectric layer-stack 92-3. In accordance with some embodiments, dielectric layer-stack 92-3 includes aluminum oxide layers 88" and high-k dielectric layers 90". High-k dielectric layers 90" may also include zirconium oxide layer 90A" and hafnium oxide layer 90B" in accordance with some embodiments. In accordance with some embodiments, the ALD cycle numbers for forming zirconium oxide layer 90A" and hafnium oxide layer 90B" may be the same as (or greater than or smaller than) the corresponding ALD cycle numbers for forming zirconium oxide layer 90A and hafnium oxide layer 90B.

In accordance with some embodiments, capacitor insulator 58-1 (FIG. 21) includes a single dielectric layer-stack 92-2 and/or a single dielectric layer-stack 92-3. In accordance with alterative embodiments, dielectric layer-stack 92-2 may be repeated and stacked over (and may contact) the illustrated dielectric layer-stack 92-2. Dielectric layer-stack 92-3 may also be repeated and stacked over (and may contact) the illustrated dielectric layer-stack 92-3.

Figure 20:
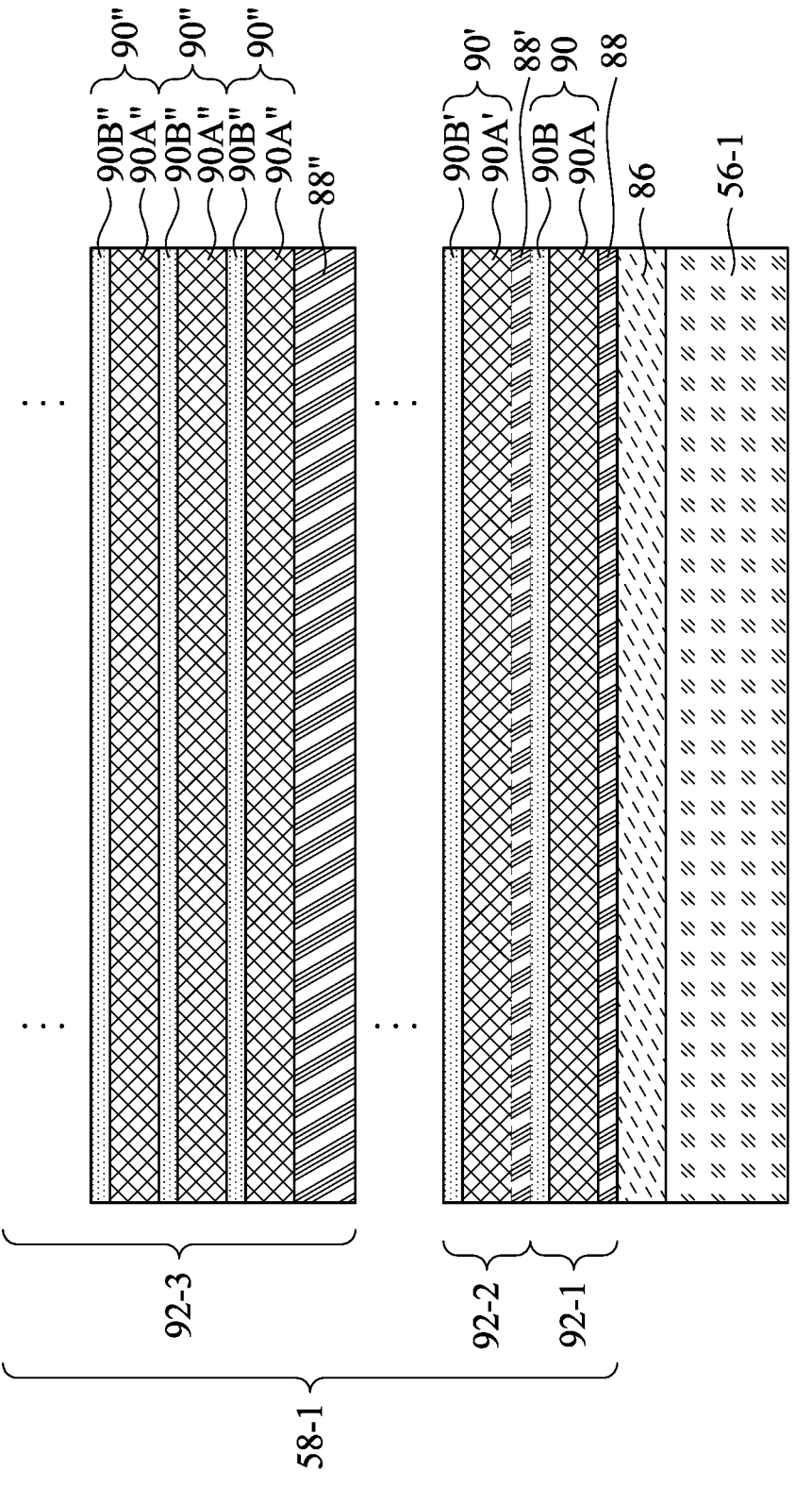
Figure 21:
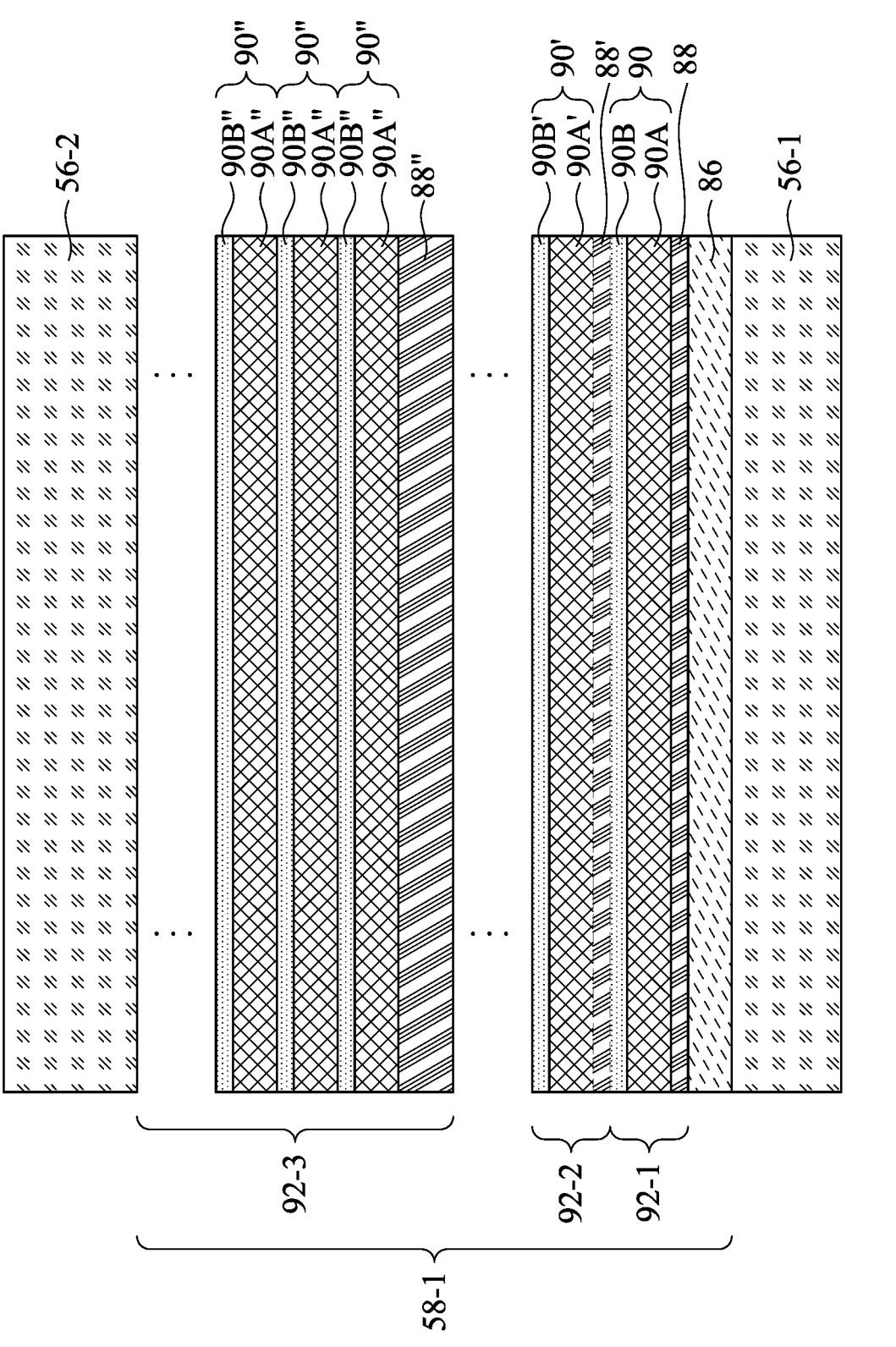

Next, referring to FIG. 20, the formation of dielectric layer-stack 92-3 is continued, and more high-k dielectric layers 90", which may be identical to (or may have different ALD cycle numbers than) the high-k dielectric layers 90" in FIG. 19, are formed and stacked. There may not be (or there may be) aluminum oxide layer between the plurality of high-k dielectric layers 90" in accordance with some embodiments. For example, the total number of high-k dielectric layers 90" (which number is referred to as high-k repeating count) may be in the range between about 4 and about 10.

Figure 23:
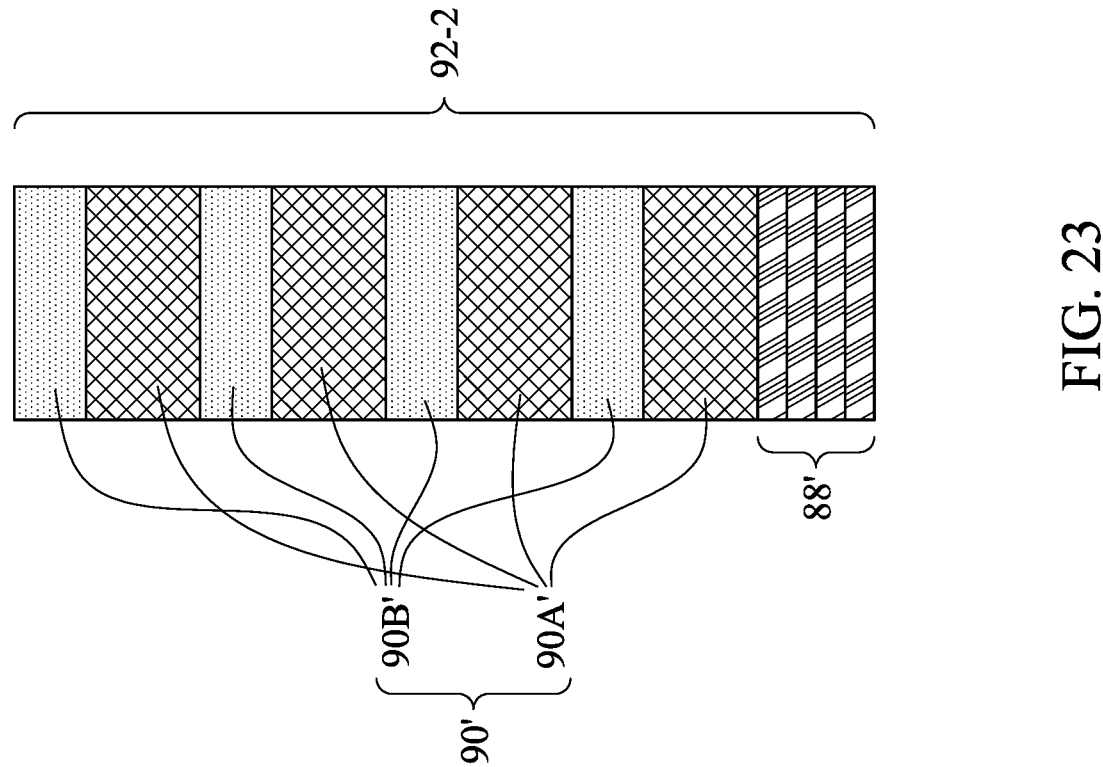
FIGS. 22 and 23 illustrate the structures of some capacitor insulators in accordance with some embodiments.
Figure 22:
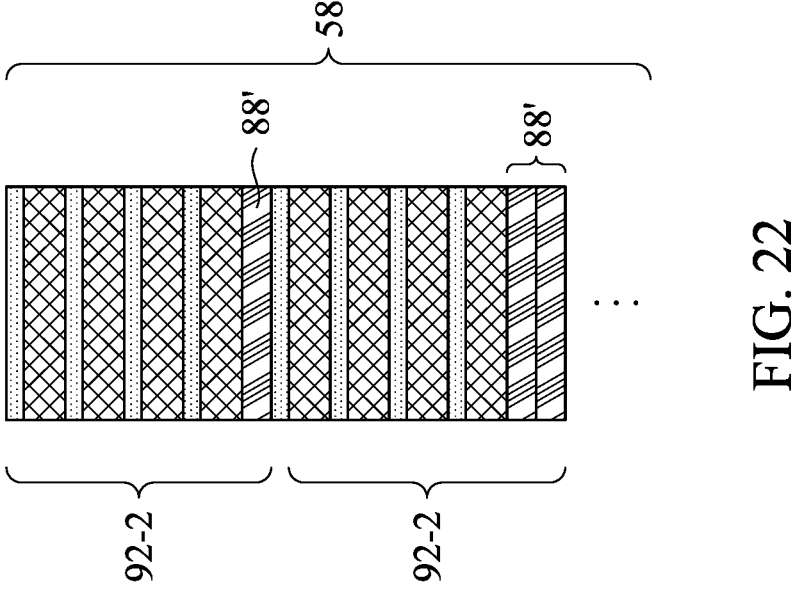

FIGS. 22 and 23 illustrate an example capacitor insulator 58 and the layer-stacks therein. FIG. 22 illustrates that capacitor insulator 58 includes two layer-stacks 92-2, with layer stacks 92-2 including the aluminum oxide layer formed using one or a plurality of ALD layers. FIG. 23 illustrates an example layer-stack 92-2, which includes aluminum oxide layer 88' formed through four (or 1, 2, or 3) ALD layers, and four repetitions of zirconium oxide layer 90A' and hafnium oxide layer 90B'. It is appreciated that although aluminum oxide layer 88' has an ALD cycle number greater than 1, its average ALD cycle number per high-k dielectric ALD cycle is low, as will be discussed in subsequent paragraphs.

Referring to FIG. 20, in accordance with some embodiments, the bottom layer stack 92-1 includes aluminum oxide layer 88 having ALD cycle number CN88, and the total ALD cycle number for forming high-k dielectric layer 90 is CN90. Accordingly, for each ALD cycle for forming the high-k dielectric layer, on average, the ALD cycle number for forming the underlying aluminum oxide is equal to CN88/CN90. Layer stack 92-2 includes aluminum oxide layer 88' (if any) having ALD cycle number CN88' (which may be zero or a non-zero number), and the total ALD cycle number for forming high-k dielectric layer 90' is CN90'. The ratio CN88/CN90 is smaller than ratio CN88'/CN90'. Alternatively stated, while layer stacks 92-2 and/or 92-3 may sometimes have the aluminum oxide ALD cycle number being greater than 1, the average aluminum oxide ALD cycle number per unit high-k dielectric ALD cycle is lower than the average aluminum oxide ALD cycle number per unit high-k dielectric ALD cycle in layer stack 90-1. For example, assuming ALD cycle number CN88 is equal to 2, and ALD cycle number CN90 is equal to 9 (7 ALD cycles for forming zirconium oxide and two ALD cycles for forming hafnium oxide), ratio CN88/CN90 is 2/9. As a comparison, number CN88' may be equal to 0 or 1, and number CN90' may be equal to 9 (7 ALD cycles for forming zirconium oxide and two ALD cycles for forming hafnium oxide), ratio CN88'/CN90' is 0 or 1/9, which is smaller than ratio CN88/CN90.

Also, the example layer stack 92-3 includes aluminum oxide layer 88" having ALD cycle number CN88", and the total ALD cycle number for forming all high-k dielectric layer 90" is CN90". The ratio CN88"/CN90" is also smaller than ratio CN88/CN90. For example, assuming ALD cycle number CN88" is equal to 4, and the total ALD cycle number CN90" may be equal to 36 (with each high-k dielectric layers 90" including 7 ALD cycles for forming zirconium oxide and two ALD cycles for forming hafnium oxide, and four high-k dielectric layers 90" in total), ratio CN88"/CN90" is 4/36 (equal to 1/9), which is again smaller than ratio CN88/CN90. In another example, assuming number CN88" is equal to 2, and number CN90" may be equal to 18 (7 ALD cycles for forming zirconium oxide and two ALD cycles for forming hafnium oxide, and two high-k dielectric layers 90"), ratio CN88"/CN90" is 2/18 (equal to 1/9), which is smaller than ratio CN88/CN90 (2/9).

In accordance with some embodiments, to enhance the diffusion of aluminum in aluminum oxide layer 88 into TiON layer 86 and to form better intermixing layer, in the formation of aluminum oxide layer 88 the pulsing of the TMA is performed for a long period of time. For example, the pulsing of the TMA in the formation of aluminum oxide layer 88 may last for a first duration (D88) longer than the second duration (D88') for pulsing of the TMA in the formation of overlying aluminum oxide layers (such as aluminum oxide layer 88' and/or 88"). In accordance with some embodiments, the ratio D88/D88' is greater than about 2, and may be greater than about 5 or 10.

In accordance with some embodiments, to enhance the diffusion of aluminum in aluminum oxide layer 88 into TiON layer 86 and to form better intermixing layer, in the formation of aluminum oxide layer 88 the pulsing of the TMA is performed for a long period of time. For example, the pulsing of the TMA in the formation of aluminum oxide layer 88 ma last for a first duration (D88) longer than the second duration (D88') for pulsing of the TMA in the formation of overlying aluminum oxide layers (such as aluminum oxide layer 88' and/or 88"). In accordance with some embodiments, the ratio D88/D88' is greater than about 2, and may be greater than about 5 or 10.

The formation of capacitor insulator 58-1 may thus be finished. It is appreciated that the discussed dielectric layer-stacks 92-2 and 92-3 are examples, and there may be more dielectric layer stacks different from layer-stacks 92-2 and 92-3 being stacked. In accordance with some embodiments, the aluminum oxide layer 88 in the bottom layer-stack 92-1 either have a greater ALD cycle number or a greater ratio CN88/CN90 than all aluminum oxide layers (such as 88' and 88") in all overlying layer-stacks in capacitor insulator 58-1. In accordance with some embodiments, all aluminum oxide layers (such as 88' and 88") in all layer-stacks over layer-stack 92-1 may have ALD cycle number equal to 1.

The embodiments of the present disclosure have some advantageous features. By increasing the number of the ALD cycles (rather than using a single ALD cycle for minimizing effective k value for the capacitor insulator) for forming aluminum oxide (or another high-bandgap material), the re-oxidation of the capacitor electrode is reduced. The peeling of TiON from the underlying capacitor electrode is reduced, and the leakage current of the capacitor is reduced. The capacitor formed in accordance with the embodiments of the present disclosure balances the reliability with the requirement of high k values (and hence high capacitance for good noise suppressing ability). The capacitor is thus suitable for being used as decoupling capacitors.

In accordance with some embodiments, a method includes forming a capacitor comprising forming a first capacitor electrode; forming a first capacitor insulator over the first capacitor electrode, wherein the forming the first capacitor insulator comprises oxidizing a top surface layer of the first capacitor electrode to form a metal oxide layer on the first capacitor electrode; depositing a first aluminum oxide layer through a first ALD process comprising a first plurality of ALD cycles, and the first plurality of ALD cycles have a first ALD cycle number; and depositing a first high-k dielectric layer over the first aluminum oxide layer, wherein the first high-k dielectric layer is deposited through a second ALD process having a second ALD cycle number different from the first ALD cycle number; and forming a second capacitor electrode over and contacting the first capacitor insulator.

In an embodiment, the method further comprises, before the second capacitor electrode is formed, depositing a second aluminum oxide layer over the first high-k dielectric layer, wherein the second aluminum oxide layer is deposited through a third ALD process, and the third ALD process has a third ALD cycle number smaller than the first ALD cycle number; and depositing a second high-k dielectric layer over the second aluminum oxide layer. In an embodiment, the third ALD process is a single-ALD-cycle process. In an embodiment, the second high-k dielectric layer is formed through a fourth ALD process having a fourth ALD cycle number, and wherein a first ratio of the first ALD cycle number to the second ALD cycle number is greater than a second ratio of the third ALD cycle number to the fourth ALD cycle number.

In an embodiment, the second high-k dielectric layer comprises a plurality of dielectric layer-stacks, and each of the dielectric layer-stacks comprises a zirconium layer; and a hafnium layer over the zirconium layer, wherein the plurality of dielectric layer-stacks are stacked, with higher stacks in the plurality of dielectric layer-stacks being over lower stacks in the plurality of dielectric layer-stacks. In an embodiment, the forming the capacitor further comprises forming a second capacitor insulator over the second capacitor electrode; forming a first contact plug electrically connecting to the first capacitor electrode; and forming a second contact plug electrically connecting to the second capacitor electrode.

In an embodiment, the first capacitor electrode comprises titanium nitride, and the first high-k dielectric layer comprises a dielectric layer-stack comprising a zirconium layer; and a hafnium layer over the zirconium layer. In an embodiment, the capacitor is a decoupling capacitor, and the method further comprising connecting the first capacitor electrode and the second capacitor electrode to VDD and VSS, respectively. In an embodiment, the first high-k dielectric layer comprises dielectric materials having higher dielectric constant values than the first aluminum oxide layer, and wherein the first high-k dielectric layer has a lower bandgap than the first aluminum oxide layer. In an embodiment, the forming the second capacitor electrode comprises depositing a blanket conductive layer; and patterning the blanket conductive layer through a dry etching process, with the dry etching process being performed with plasma being generated.

In accordance with some embodiments, a method comprises forming a first titanium nitride layer; patterning the first titanium nitride layer as a first capacitor electrode; and forming a capacitor insulator over the first capacitor electrode, wherein the forming the capacitor insulator comprises depositing a first aluminum oxide layer over the first capacitor electrode using a first ALD process having a first ALD cycle number; depositing a first high-k dielectric layer over the first capacitor electrode; depositing a second aluminum oxide layer over the first capacitor electrode using a second ALD process having a second ALD cycle number smaller than the first ALD cycle number; and depositing a second high-k dielectric layer over the second aluminum oxide layer.

In an embodiment, the second ALD cycle number is equal to 1, and the first ALD cycle number is greater than 1. In an embodiment, the method further comprises forming a plurality of aluminum oxide layers and a plurality of high-k dielectric layers, wherein the plurality of aluminum oxide layers and the plurality of high-k dielectric layers are allocated alternatingly, and wherein all of aluminum oxide layers over the second high-k dielectric layer are formed using single-cycle-ALD processes. In an embodiment, forming the capacitor insulator further comprises converting a top surface portion of the first titanium nitride layer to form a titanium oxynitride layer, wherein the first aluminum oxide layer is formed over the titanium oxynitride layer.

In an embodiment, the depositing the first aluminum oxide layer comprises a first plurality of ALD cycles, and each of the first plurality of ALD cycles comprising pulsing an aluminum-containing precursor for a first duration; and the depositing the second aluminum oxide layer comprises a second plurality of ALD cycles, and each of the second plurality of ALD cycles comprises pulsing the aluminum-containing precursor for a second duration, and the first duration is longer than the second duration.

In an embodiment, the depositing the first high-k dielectric layer comprising forming a layer-stack comprising depositing a zirconium layer; and depositing a hafnium layer over the zirconium layer. In an embodiment, the method further comprises forming a plurality of layer-stacks over and contacting the layer-stack, with each of the plurality of layer-stacks being identical to the layer-stack, and wherein overlying ones of the plurality of layer-stacks are in physical contact with lower ones of the plurality of layer-stacks.

In accordance with some embodiments, a method comprises forming a first capacitor electrode; depositing a second capacitor electrode over the first capacitor electrode; forming a capacitor insulator between the first capacitor electrode and the second capacitor electrode, wherein the forming the capacitor insulator comprising depositing a first aluminum oxide layer over the first capacitor electrode using a first ALD process having a first ALD cycle number; depositing a first high-k dielectric layer over the first capacitor electrode, wherein the first high-k dielectric layer is depositing using a second ALD process having a second ALD cycle number; depositing a second aluminum oxide layer over the first high-k dielectric layer using a third ALD process having a third ALD cycle number; and depositing a second high-k dielectric layer over the second aluminum oxide layer, wherein the second high-k dielectric layer is depositing using a fourth ALD process having a fourth ALD cycle number, and wherein a first ratio of the first ALD cycle number to the second ALD cycle number is greater than a second ratio of the third ALD cycle number to the fourth ALD cycle number.

In an embodiment, the forming the capacitor insulator further comprises forming a plurality of aluminum oxide layers and a plurality of high-k dielectric layers over the second high-k dielectric layer, wherein the plurality of aluminum oxide layers and the plurality of high-k dielectric layers are allocated alternatingly, and wherein a third ratio of an ALD cycle number of each of the plurality of aluminum oxide layers to another ALD cycle number of an immediate overlying one of the plurality of high-k dielectric layers is smaller than the first ratio. In an embodiment, the first capacitor electrode comprises titanium nitride, and the method further comprises forming a titanium oxynitride layer between and contacting the first capacitor electrode and the first aluminum oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a capacitor comprising:
    forming a first capacitor electrode;
    forming a first capacitor insulator over the first capacitor electrode, wherein the forming the first capacitor insulator comprises:
        oxidizing a top surface layer of the first capacitor electrode to form a metal oxide layer on the first capacitor electrode;
        depositing a first aluminum oxide layer through a first Atomic Layer Deposition (ALD) process comprising a first plurality of ALD cycles, and the first plurality of ALD cycles have a first ALD cycle number, wherein an ALD cycle of the first ALD process comprises pulsing an aluminum-containing precursor for a first duration;
        depositing a first high-k dielectric layer over the first aluminum oxide layer, wherein the first high-k dielectric layer is deposited through a second ALD process having a second ALD cycle number different from the first ALD cycle number; and depositing a second aluminum oxide layer over the first high-k dielectric layer, wherein the second aluminum oxide layer is deposited through a third ALD process, wherein an additional ALD cycle in the third ALD process comprises pulsing the aluminum-containing precursor for a second duration, and the first duration is longer than the second duration; and forming a second capacitor electrode over and contacting the first capacitor insulator.

2. The method of claim 1, wherein the third ALD process has a third ALD cycle number smaller than the first ALD cycle number, and the method further comprises:

depositing a second high-k dielectric layer over the second aluminum oxide layer.

3. The method of claim 2, wherein the third ALD process is a single-ALD-cycle process.

4. The method of claim 2, wherein the second high-k dielectric layer is formed through a fourth ALD process having a fourth ALD cycle number, and wherein a first ratio of the first ALD cycle number to the second ALD cycle number is different from a second ratio of the third ALD cycle number to the fourth ALD cycle number.

5. The method of claim 2, wherein the second high-k dielectric layer comprises a plurality of dielectric layer-stacks, and each of the dielectric layer-stacks comprises:

a zirconium layer; and a hafnium layer over the zirconium layer, wherein the plurality of dielectric layer-stacks are stacked, with higher stacks in the plurality of dielectric layer-stacks being over lower stacks in the plurality of dielectric layer-stacks.

6. The method of claim 1, wherein the forming the capacitor further comprises:

forming a second capacitor insulator over the second capacitor electrode;

forming a first contact plug electrically connecting to the first capacitor electrode; and forming a second contact plug electrically connecting to the second capacitor electrode.

7. The method of claim 1, wherein the first capacitor electrode comprises titanium nitride, and the first high-k dielectric layer comprises a dielectric layer-stack comprising:

a zirconium layer; and a hafnium layer over the zirconium layer.

8. The method of claim 1, wherein the capacitor is a decoupling capacitor, and the method further comprising connecting the first capacitor electrode and the second capacitor electrode to VDD and VSS, respectively.

9. The method of claim 1, wherein the first high-k dielectric layer comprises dielectric materials having higher dielectric constant values than the first aluminum oxide layer, and wherein the first high-k dielectric layer has a lower bandgap than the first aluminum oxide layer.

10. The method of claim 1, wherein the forming the second capacitor electrode comprises:

depositing a blanket conductive layer; and patterning the blanket conductive layer through a dry etching process, with the dry etching process being performed with plasma being generated.

11. The method of claim 1, wherein each ALD cycle of the first ALD process comprises pulsing the aluminum-containing precursor for the first duration, and each ALD cycle of the third ALD process comprises pulsing the aluminum-containing precursor for the second duration that is longer than the second duration.

12. A method comprising:

forming a first titanium nitride layer;

patterning the first titanium nitride layer as a first capacitor electrode; and forming a capacitor insulator over the first capacitor electrode, wherein the forming the capacitor insulator comprises:

depositing a first aluminum oxide layer over the first capacitor electrode using a first Atomic Layer Deposition (ALD) process comprising a first plurality of ALD cycles having a first ALD cycle number, and each of the first plurality of ALD cycles comprises pulsing an aluminum-containing precursor for a first duration;

depositing a first high-k dielectric layer over the first capacitor electrode;

depositing a second aluminum oxide layer over the first capacitor electrode using a second ALD process comprising a second plurality of ALD cycles having a second ALD cycle number smaller than the first ALD cycle number, wherein each of the second plurality of ALD cycles comprises pulsing the aluminum-containing precursor for a second duration, and the first duration is longer than the second duration; and depositing a second high-k dielectric layer over the second aluminum oxide layer.

13. The method of claim 12, wherein the second ALD cycle number is equal to 1, and the first ALD cycle number is greater than 1.

14. The method of claim 12 further comprising forming a plurality of aluminum oxide layers and a plurality of high-k dielectric layers, wherein the plurality of aluminum oxide layers and the plurality of high-k dielectric layers are allocated alternatingly, and wherein all of aluminum oxide layers over the second high-k dielectric layer are formed using single-cycle-ALD processes.

15. The method of claim 12, wherein the forming the capacitor insulator further comprises:

converting a top surface portion of the first titanium nitride layer to form a titanium oxynitride layer, wherein the first aluminum oxide layer is formed over the titanium oxynitride layer.

16. The method of claim 12, wherein the depositing the first high-k dielectric layer comprising forming a layer-stack comprising:

depositing a zirconium layer; and depositing a hafnium layer over the zirconium layer.

17. The method of claim 16 further comprising forming a plurality of layer-stacks over and contacting the layer-stack, with each of the plurality of layer-stacks being identical to the layer-stack, and wherein overlying ones of the plurality of layer-stacks are in physical contact with lower ones of the plurality of layer-stacks.

18. A method comprising:

forming a first capacitor electrode;

depositing a second capacitor electrode over the first capacitor electrode;

forming a capacitor insulator between the first capacitor electrode and the second capacitor electrode, wherein the forming the capacitor insulator comprises:

depositing a first aluminum oxide layer over the first capacitor electrode using a first Atomic Layer Deposition (ALD) process comprising a first plurality of ALD cycles having a first ALD cycle number, wherein each of the first plurality of ALD cycles comprises pulsing an aluminum-containing precursor for a first duration;

depositing a first high-k dielectric layer over the first capacitor electrode, wherein the first high-k dielectric layer is depositing using a second ALD process having a second ALD cycle number;

depositing a second aluminum oxide layer over the first high-k dielectric layer using a third ALD process comprising a second plurality of ALD cycles having a third ALD cycle number, wherein each of the second plurality of ALD cycles comprises pulsing the aluminum-containing precursor for a second duration, and the first duration is longer than the second duration; and depositing a second high-k dielectric layer over the second aluminum oxide layer, wherein the second high-k dielectric layer is depositing using a fourth ALD process having a fourth ALD cycle number, and wherein a first ratio of the first ALD cycle number to the second ALD cycle number is greater than a second ratio of the third ALD cycle number to the fourth ALD cycle number.

19. The method of claim 18, wherein the forming the capacitor insulator further comprises forming a plurality of aluminum oxide layers and a plurality of high-k dielectric layers over the second high-k dielectric layer, wherein the plurality of aluminum oxide layers and the plurality of high-k dielectric layers are allocated alternatingly, and wherein a third ratio of an ALD cycle number of each of the plurality of aluminum oxide layers to another ALD cycle number of an immediate overlying one of the plurality of high-k dielectric layers is smaller than the first ratio.

20. The method of claim 18, wherein the first capacitor electrode comprises titanium nitride, and the method further comprises forming a titanium oxynitride layer between and contacting the first capacitor electrode and the first aluminum oxide layer.

* * * * *